(12) United States Patent
Becknell et al.

(10) Patent No.: US 8,580,076 B2
(45) Date of Patent: Nov. 12, 2013

(54) PLASMA APPARATUS, GAS DISTRIBUTION ASSEMBLY FOR A PLASMA APPARATUS AND PROCESSES THEREWITH

(75) Inventors: Alan Frederick Becknell, Ellicott City, MD (US); Thomas James Buckley, Ijamsville, MD (US); David Ferris, Rockville, MD (US); Richard E. Pingree, Jr., New Market, MD (US); Palanikumaran Sakthivel, Gaithersburg, MD (US); Aseem Kumar Srivastava, Germantown, MD (US); Carlo Waldfried, Falls Church, VA (US)

(73) Assignee: LAM Research Corporation, Fremont, CA (US)

( * ) Notice: Subject to any disclaimer, the term of this patent is extended or adjusted under 35 U.S.C. 154(b) by 1517 days.

(21) Appl. No.: 10/249,962

(22) Filed: May 22, 2003

(65) Prior Publication Data
US 2004/0238123 A1 Dec. 2, 2004

(51) Int. Cl.
| | |
|---|---|
| H01L 21/3065 | (2006.01) |
| C23C 16/00 | (2006.01) |
| C23C 16/4412 | (2006.01) |
| C23C 16/455 | (2006.01) |
| C23C 16/45561 | (2006.01) |
| C23C 16/45563 | (2006.01) |
| C23C 16/46 | (2006.01) |
| C23C 16/505 | (2006.01) |
| C23C 16/511 | (2006.01) |

(52) U.S. Cl.
USPC ............ 156/345.25; 156/345.29; 156/345.33; 156/345.34; 156/345.35; 156/345.36; 156/345.41; 156/345.48; 156/345.42; 118/715; 118/723 MW; 118/723 ME; 118/723 I; 118/723 IR; 118/725

(58) Field of Classification Search
USPC ....... 118/723 IR, 723 ER, 723 ME, 715, 724, 118/723 MW, 723 I, 725; 156/345.35, 156/345.29, 345.31, 345.32, 345.33, 156/345.34, 345.36, 345.37, 345.53, 156/345.25, 345.41, 345.48, 345.52
See application file for complete search history.

(56) References Cited

U.S. PATENT DOCUMENTS

| | | | | |
|---|---|---|---|---|
| 3,141,739 | A | * | 7/1964 | Lewis et al. .................... 423/262 |
| 4,341,592 | A | | 7/1982 | Shortes et al. ................... 216/58 |
| 4,773,355 | A | * | 9/1988 | Reif et al. ...................... 118/719 |
| 4,792,378 | A | | 12/1988 | Rose et al. |
| 5,356,673 | A | | 10/1994 | Schmitt et al. |
| 5,366,557 | A | * | 11/1994 | Yu ................................. 118/725 |

(Continued)

FOREIGN PATENT DOCUMENTS

| | | |
|---|---|---|
| EP | 1 150 331 A2 * | 3/2001 |
| JP | 62294180 | 12/1987 |
| WO | WO 97/37055 | 10/1997 |
| WO | WO 00/20655 | 4/2000 |

OTHER PUBLICATIONS

Webster's II New Riverside University Dictionary, "flange" p. 484, 1994.*

(Continued)

Primary Examiner — Jeffrie R Lund

(57) ABSTRACT

A plasma apparatus, various components of the plasma apparatus, and an oxygen free and nitrogen free processes for effectively removing photoresist material and post etch residues from a substrate with a carbon and/or hydrogen containing low k dielectric layer(s).

37 Claims, 9 Drawing Sheets

(56) References Cited

U.S. PATENT DOCUMENTS

| | | | |
|---|---|---|---|
| 5,498,308 A | 3/1996 | Kamarehi et al. | 216/69 |
| 5,552,017 A * | 9/1996 | Jang et al. | 438/710 |
| 5,614,026 A * | 3/1997 | Williams | 118/723 ME |
| 5,844,195 A * | 12/1998 | Fairbairn et al. | 219/121.43 |
| 5,928,426 A | 7/1999 | Aitchison | 118/724 |
| 5,961,851 A * | 10/1999 | Kamarehi et al. | 216/69 |
| 5,965,034 A * | 10/1999 | Vinogradov et al. | 216/68 |
| 5,968,275 A | 10/1999 | Lee et al. | 118/504 |
| 5,985,007 A * | 11/1999 | Carrea et al. | 96/126 |
| 5,986,747 A * | 11/1999 | Moran | 356/72 |
| 5,994,678 A * | 11/1999 | Zhao et al. | 219/530 |
| 6,010,748 A * | 1/2000 | Van Buskirk et al. | 427/248.1 |
| 6,045,618 A | 4/2000 | Raoux et al. | 55/284 |
| 6,057,645 A * | 5/2000 | Srivastava et al. | 315/111.21 |
| 6,082,374 A | 7/2000 | Huffman et al. | 118/723 R |
| 6,090,210 A | 7/2000 | Ballance et al. | 118/50.1 |
| 6,106,625 A * | 8/2000 | Koai et al. | 118/715 |
| 6,190,507 B1 | 2/2001 | Whealton et al. | 422/186 |
| 6,190,732 B1 * | 2/2001 | Omstead et al. | 427/248.1 |
| 6,193,802 B1 | 2/2001 | Pang et al. | 118/723 L |
| 6,194,628 B1 | 2/2001 | Pang et al. | 588/900 |
| 6,255,222 B1 | 7/2001 | Xia et al. | 438/710 |
| 6,281,135 B1 | 8/2001 | Han et al. | 438/725 |
| 6,352,050 B2 * | 3/2002 | Kamarehi et al. | 118/723 ME |
| 6,366,346 B1 * | 4/2002 | Nowak et al. | 356/72 |
| 6,367,412 B1 * | 4/2002 | Ramaswamy et al. | 118/723 I |
| 6,368,567 B2 | 4/2002 | Comita et al. | 423/240 R |
| 6,391,146 B1 | 5/2002 | Bhatnagar et al. | |
| 6,415,736 B1 | 7/2002 | Hao et al. | 118/723 E |
| 6,422,002 B1 | 7/2002 | Whealton et al. | 60/275 |
| 6,444,039 B1 * | 9/2002 | Nguyen | 118/715 |
| 6,471,822 B1 * | 10/2002 | Yin et al. | 156/345.49 |
| 6,492,186 B1 | 12/2002 | Han et al. | 438/8 |
| 6,503,330 B1 * | 1/2003 | Sneh et al. | 118/723 ME |
| 6,537,419 B1 * | 3/2003 | Kinnard | 156/345.34 |
| 6,538,734 B2 | 3/2003 | Powell | |
| 6,548,416 B2 | 4/2003 | Han et al. | 438/710 |
| 6,565,661 B1 * | 5/2003 | Nguyen | 118/715 |
| 6,592,817 B1 | 7/2003 | Tsai et al. | |
| 6,599,367 B1 * | 7/2003 | Nakatsuka | 118/715 |
| 6,633,391 B1 * | 10/2003 | Oluseyi et al. | 356/630 |
| 6,635,117 B1 * | 10/2003 | Kinnard et al. | 118/724 |
| 6,692,649 B2 * | 2/2004 | Collison et al. | 216/67 |
| 6,761,796 B2 * | 7/2004 | Srivastava et al. | 156/345.38 |
| 6,782,843 B2 * | 8/2004 | Kinnard et al. | 118/723 E |
| 6,783,627 B1 * | 8/2004 | Mahawili | 156/345.38 |
| 6,849,559 B2 * | 2/2005 | Balasubramaniam et al. | 438/758 |
| 7,037,846 B2 * | 5/2006 | Srivastava et al. | 438/710 |
| 8,268,181 B2 * | 9/2012 | Srivastava et al. | 216/60 |
| 2001/0016674 A1 | 8/2001 | Pang et al. | 588/227 |
| 2002/0066535 A1 | 6/2002 | Brown et al. | |
| 2002/0088542 A1 | 7/2002 | Nishikawa et al. | 156/345.29 |
| 2002/0144706 A1 | 10/2002 | Davis et al. | |
| 2002/0144785 A1 | 10/2002 | Srivastava et al. | 156/345.35 |
| 2003/0012624 A1 | 1/2003 | Kinnard et al. | 414/217 |
| 2003/0022511 A1 * | 1/2003 | Han et al. | 438/710 |
| 2003/0032300 A1 | 2/2003 | Waldfried et al. | 438/725 |
| 2003/0094134 A1 | 5/2003 | Minami | |
| 2003/0194876 A1 * | 10/2003 | Balasubramaniam et al. | 438/725 |
| 2003/0205328 A1 * | 11/2003 | Kinnard et al. | 156/345.37 |
| 2004/0084412 A1 * | 5/2004 | Waldfried et al. | 216/67 |
| 2004/0129211 A1 | 7/2004 | Blonigen et al. | 118/715 |
| 2004/0140053 A1 | 7/2004 | Srivastava et al. | 156/345.39 |
| 2004/0144489 A1 * | 7/2004 | Satoh et al. | 156/345.35 |
| 2004/0149223 A1 * | 8/2004 | Collison et al. | 118/723 IR |
| 2004/0150012 A1 * | 8/2004 | Jin et al. | 257/255 |
| 2004/0152296 A1 * | 8/2004 | Matz et al. | 438/623 |
| 2004/0206305 A1 * | 10/2004 | Choi et al. | 118/715 |
| 2004/0229449 A1 * | 11/2004 | Biberger et al. | 438/584 |
| 2004/0235299 A1 * | 11/2004 | Srivastava et al. | 438/689 |
| 2004/0238123 A1 * | 12/2004 | Becknell et al. | 156/345.33 |
| 2005/0014361 A1 * | 1/2005 | Nguyen et al. | 438/623 |
| 2005/0022839 A1 * | 2/2005 | Savas et al. | 134/1.2 |
| 2005/0079717 A1 * | 4/2005 | Savas et al. | 438/689 |
| 2005/0241767 A1 * | 11/2005 | Ferris et al. | 156/345.35 |
| 2005/0263170 A1 * | 12/2005 | Tannous et al. | 134/1.1 |
| 2010/0055807 A1 * | 3/2010 | Srivastava et al. | 438/9 |
| 2011/0136346 A1 * | 6/2011 | Geissbuhler et al. | 438/710 |

OTHER PUBLICATIONS

English Abstract of JP 62294180, courtesy of http://v3.espacenet.com (attached to JP 62294180), Publication date of JP 62294180 is Dec. 21, 1987.

* cited by examiner

PLASMA APPARATUS, GAS DISTRIBUTION ASSEMBLY FOR A PLASMA APPARATUS AND PROCESSES THEREWITH

BACKGROUND

The present disclosure relates to semiconductor apparatuses and processes, and more particularly, to plasma mediated processes and plasma apparatuses suitable for ashing organic material from a substrate including a low k dielectric material.

Recently, much attention has been focused on developing low k dielectric thin films for use in the next generation of microelectronics. As integrated devices become smaller, the RC-delay time of signal propagation along interconnects becomes one of the dominant factors limiting overall chip speed. With the advent of copper technology, R has been pushed to its practical lowest limit so attention must be focused on reducing C. One way of accomplishing this task is to reduce the average dielectric constant (k) of the thin insulating films surrounding interconnects. The dielectric constant (k) of traditional silicon dioxide insulative materials is about 3.9. Lowering the dielectric constant (k) below 3.9 will provide a reduced capacitance and improve overall chip speed.

Low k dielectric materials used in advanced integrated circuits typically comprise organic polymers or oxides and have dielectric constants less than about 3.5. The low k dielectric materials can be spun onto the substrate as a solution or deposited by a chemical vapor deposition process. Important low k film properties include thickness and uniformity, dielectric constant, refractive index, adhesion, chemical resistance, thermal stability, pore size and distribution, coefficient of thermal expansion, glass transition temperature, film stress, and copper diffusion coefficient.

In fabricating integrated circuits on wafers, the wafers are generally subjected to many process steps before finished integrated circuits can be produced. Low k dielectric materials, especially carbon containing low k dielectric materials, can be sensitive to some of these process steps. For example, plasma used during an "ashing" step can strip both photoresist materials as well as remove a portion of the low-k dielectric film. Ashing generally refers to a plasma mediated stripping process by which residual photoresist and post etch residues are stripped or removed from a substrate upon exposure to the plasma. The ashing process generally occurs after an etching or implant process has been performed in which a photoresist material is used as a mask for etching a pattern into the underlying substrate or for selectively implanting ions into the exposed areas of the substrate. The remaining photoresist and any post etch or post implant residues on the wafer after the etch process or implant process is complete must be removed prior to further processing for numerous reasons generally known to those skilled in the art. The ashing step is typically followed by a wet chemical treatment to remove traces of the residue, which can cause further degradation of the low k dielectric, loss of material, and may also cause increase in the dielectric constant.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high-energy ion bombardment at low temperatures and low pressures (of the order of millitorr) to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and is generally chosen to remove the photoresist mask layer at a rate much greater than the removal rate of the underlying substrate. Moreover, most ashing processes heat the substrate to temperatures greater than 200° C. to increase the plasma reactivity, and are performed at relatively higher pressures (of the order of a torr). Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing underlying layers, e.g., low k dielectric layers.

Studies have suggested that a significant contribution to low k dielectric degradation during photoresist removal processes results from the use of oxygen and/or nitrogen and/or fluorine containing gas sources for generating ashing plasmas. Although gas mixtures containing one or more of these sources efficiently ash photoresist from the substrate, the use of these gas sources has proven detrimental to substrates containing low k dielectrics. For example, oxygen-containing plasmas are known to raise the dielectric constant of low k dielectric underlayers during plasma processing. The increases in dielectric constant affects, among others, interconnect capacitance, which directly impacts device performance. Moreover, the use of oxygen-containing plasmas is generally less preferred for advanced device fabrication employing copper metal layers since copper metal is readily oxidized. Occasionally, the damage caused by oxygen containing plasmas is not readily detected during metrology inspection of the substrate after plasma processing. However, the damage can be readily demonstrated and observed by a subsequent wet cleaning process, as may be typically employed after plasma ashing, wherein portions of the carbon and/or hydrogen-containing low k dielectric material are removed. The removed portions of the dielectric material are a source of variation in the critical dimension (CD) of the feature that is frequently unacceptable and impacts overall device yield. Moreover, even if a wet clean process is not included, the electrical and mechanical properties of the dielectric material may be changed by exposure to the oxygen-free plasmas thereby affecting operating performance. It is believed that carbon is depleted from the dielectric material during the oxygen containing plasma exposure.

Ideally, the ashing plasma should not affect the underlying low k dielectric layers and preferentially removes only the photoresist material. The use of traditional dielectrics (higher k values) such as $SiO_2$ provided high selectivity with these gas sources and was suitable for earlier device generation. However, in order to minimize damage to the low k dielectric, oxygen free and nitrogen free plasma processes have been developed. One such process includes generating plasma from a gas mixture comprising helium and hydrogen resulting in a different mechanism of removal. The oxygen free and nitrogen free plasma such as the plasma formed from helium and hydrogen is less aggressive and does not completely react with the photoresist in the traditional sense. Rather, it is believed that the plasma renders portions of the photoresist to be removable such as by sublimation. As a result of the mechanism of removal, while effective for removing photoresist material from the substrate, the plasma exposure tends to deposit large bodies of the sublimed or removed photoresist and byproducts within the processing chamber and in areas downstream from the plasma process chamber such as in the exhaust lines and any components therein. The buildup of ashing material can lead to short mean-time-between-clean (MTBC) and frequent rebuild/replacement of vacuum hardware resulting in loss of throughput and increased costs of ownership. Additionally, deposits of photoresist material within the process chamber that are located above the plane of the substrate can lead to particulate contamination on the substrate, thereby further affecting device yields.

An additional problem with oxygen free and nitrogen free plasmas is the non-uniformity of the plasma exposure. Since these plasmas are less aggressive, non-uniformity is a significant issue. Some downstream plasma ashers have a narrow diameter orifice plasma tube in which the plasma is generated. The diameter of the substrate is generally much larger than the diameter of the plasma tube orifice. As such, baffle plates are typically positioned near the plasma tube outlet to deflect the plasma as it enters the process chamber such that the species in the plasma are uniformly dispersed across the substrate. However, it has been found that the less aggressive plasmas exhibit less ashing efficiency as reactive species are dispersed from the center point of the baffle plate to its outer edge resulting in hot spots, i.e., areas of non-uniformity. For example, it has been discovered that hydrogen radicals generated within a plasma decrease in ashing efficiency as the hydrogen radicals travel from the center most impingement point on the baffle plate in the axial flow reactor to the outer edges of the baffle plate. In chamber designs where the diameter of the wafer is comparable to that of the plasma tube, non-uniformity of radicals can be mitigated in other ways.

Another problem with oxygen free and nitrogen free plasmas concerns endpoint detection. Traditional endpoint detection methods and apparatus are not suitable for use with these types of plasmas. For example, as in the case of plasma formed from a hydrogen and helium gas mixture, no optically excited species are emitted that are sufficient to generate a signal suitable for endpoint detection.

Accordingly, there remains a need for improved processes and apparatuses for generating oxygen and nitrogen free plasmas for use with low k dielectrics.

BRIEF SUMMARY

Disclosed herein is an axial flow downstream plasma treatment device for treating a substrate, comprising, in combination, a gas source; a plasma generating component in fluid communication with the gas source, the plasma generating component comprising a plasma tube and a plasma generator coupled to the plasma tube for generating a plasma within the plasma tube from the gas source; a process chamber in fluid communication with the plasma tube comprising a baffle plate assembly about an inlet of the process chamber, wherein the baffle plate assembly comprises a generally planar upper baffle plate fixedly positioned above a generally planar lower baffle plate, the upper baffle plate being smaller than the lower baffle plate so as to form a plenum between the lower baffle plate and an upper wall of the process chamber, the lower baffle plate comprising a plurality of apertures radially disposed about a central axis, wherein a dimension of each one of the plurality of apertures increases from the central axis to an outer edge of the lower baffle plate, and wherein the baffle plate assembly is positioned generally parallel to the substrate; and an exhaust conduit centrally located in a bottom wall of the process chamber.

In another embodiment, an axial flow downstream plasma treatment device for treating a substrate, comprising, in combination, a gas source; a plasma generating component in fluid communication with the gas source, the plasma generating component comprising a plasma tube and a plasma generator coupled to the plasma tube for generating a plasma within the plasma tube from the gas source; a process chamber in fluid communication with the plasma tube comprising a baffle plate assembly at about an inlet of the process chamber, wherein the baffle plate assembly comprises a generally planar upper baffle plate fixedly positioned above a generally planar lower baffle plate, the upper baffle plate being smaller than the lower baffle plate so as to form a plenum between the lower baffle plate and an upper wall of the process chamber, the lower baffle plate comprising a plurality of apertures radially disposed about a central axis, wherein the plurality of apertures increase in density from the central axis to an outer edge of the lower baffle plate; and an exhaust conduit centrally located in a bottom wall of the process chamber.

In another embodiment, an axial flow downstream plasma treatment device for treating a substrate containing a carbon and/or hydrogen containing low k dielectric layer, the plasma treatment device comprising, in combination, a gas source comprising substantially nitrogen free and oxygen free gases; a gas purifier in fluid communication with the gas source adapted to reduce nitrogen containing species and oxygen containing species from the substantially nitrogen free and oxygen free gases; a plasma generating component in fluid communication with the gas purifier, the plasma generating component comprising a plasma tube and a plasma generator coupled to the plasma tube for generating a plasma within the plasma tube from the purified nitrogen free and oxygen free gases; a process chamber in fluid communication with the plasma tube comprising a baffle plate assembly at an inlet of the process chamber; an exhaust conduit centrally located within the process chamber comprising a gas port in fluid communication with an oxidizing gas source; an afterburner assembly coupled to the exhaust conduit and adapted to generate a plasma, preferably oxidizing, in the exhaust conduit; and an optical detection system coupled to the exhaust conduit comprising collection optics focused within a plasma discharge region provided by the oxidizing plasma.

In yet another embodiment, a downstream plasma treatment device for treating a substrate, comprising, in combination a gas source; a plasma generating component in fluid communication with the gas source, the plasma generating component comprising a plasma tube and a plasma generator coupled to the plasma tube for generating a plasma within the plasma tube from the gas source; a process chamber in fluid communication with the plasma tube; and a gas purifier intermediate to the gas source and the plasma generator.

Also disclosed herein is a plasma processing chamber for processing a substrate contained therein, comprising a baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, wherein a dimension of each one of the plurality of apertures increases from the central axis to an outer edge of the lower baffle plate, and wherein the baffle plate assembly is positioned generally parallel to the substrate.

In another embodiment, the plasma processing chamber for processing a substrate contained therein, comprises a baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, wherein the plurality of apertures increase in density from the central axis to an outer edge of the lower baffle plate.

Also disclosed herein is a baffle plate assembly for distributing gas flow into an adjacent process chamber containing a semiconductor wafer to be processed, comprising a generally planar upper baffle plate fixedly positioned above a generally planar lower baffle plate, the upper baffle plate being smaller than the lower baffle plate, the lower baffle plate comprising a plurality of apertures radially disposed about a central axis, wherein the plurality of apertures increase in density from the central axis to an outer edge of the lower baffle plate.

In another embodiment, the baffle plate assembly for distributing gas flow into an adjacent process chamber containing a semiconductor wafer to be processed, comprises a generally planar upper baffle plate fixedly positioned above a generally planar lower baffle plate, the upper baffle plate being smaller than the lower baffle plate, the lower baffle plate comprising a plurality of apertures radially disposed about a central axis, and wherein a dimension of each one of the plurality of apertures increases from the central axis to an outer edge of the lower baffle plate.

A process for uniformly distributing excited species generated in an oxygen free and nitrogen free plasma onto a substrate, comprises introducing the excited species into a plasma processing chamber, wherein the plasma processing chamber comprises a baffle plate assembly for receiving the excited species, the baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, and wherein a dimension of each one of the plurality of apertures increases from the central axis to an outer edge of the lower baffle plate; and exposing the substrate to the excited species after flowing through baffle plate assembly.

In another embodiment, a process for uniformly distributing excited species generated in an oxygen free and nitrogen free plasma onto a substrate, comprises introducing the excited species into a plasma processing chamber, wherein the plasma processing chamber comprises a baffle plate assembly for receiving the excited species, the baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, wherein the plurality of apertures increase in density from the central axis to an outer edge of the lower baffle plate; and exposing the substrate to the excited species after flowing through baffle plate assembly.

A plasma ashing process for removing photoresist material and post etch residues from a substrate containing a carbon and/or hydrogen containing low k dielectric layer comprises flowing a substantially oxygen free and nitrogen free gas into a gas purifier to form a purified gas with reduced levels of contaminants; forming a plasma from the purified gas; introducing the plasma into a process chamber, wherein the process chamber comprises a baffle plate assembly for receiving the plasma, the baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, wherein the plurality of apertures increase in density from the central axis to an outer edge of the lower baffle plate; flowing the plasma through the baffle plate assembly and exposing the substrate to remove the photoresist material, post etch residues, and volatile byproducts from substrate; exhausting the removed photoresist material, post etch residues, and volatile byproducts into a centrally located exhaust conduit in the process chamber; selectively introducing an oxidizing gas into the exhaust conduit; forming a plasma from the oxidizing gas and the removed photoresist material, post etch residues, and volatile byproducts; optically monitoring an emission signal produced in the exhaust conduit plasma; and detecting an endpoint of the photoresist and post etch residues from an observed change in the emission signal.

In another embodiment, a plasma ashing process for removing photoresist material and post etch residues from a substrate containing a carbon and/or hydrogen containing low k dielectric layer comprises flowing a substantially oxygen free and nitrogen free gas into a gas purifier to form a purified gas with reduced levels of contaminants; forming a plasma from the purified gas; introducing the plasma into a process chamber, wherein the process chamber comprises a baffle plate assembly for receiving the plasma, the baffle plate assembly comprising a generally planar upper baffle plate fixedly positioned above a generally planar lower baffle plate, the upper baffle plate being smaller than the lower baffle plate, the lower baffle plate comprising a plurality of apertures radially disposed about a central axis, and wherein a dimension of each one of the plurality of apertures increases from the central axis to an outer edge of the lower baffle plate; flowing the plasma through the baffle plate assembly and exposing the substrate to remove the photoresist material, post etch residues, and volatile byproducts from substrate; exhausting the removed photoresist material, post etch residues, and volatile byproducts into a centrally located exhaust conduit in a bottom wall of the process chamber; selectively introducing an oxidizing gas into the exhaust conduit; forming a plasma from the oxidizing gas and the removed photoresist material, post etch residues, and volatile byproducts; optically monitoring an emission signal produced in the exhaust conduit plasma; and detecting an endpoint of the photoresist and post etch residues from an observed change in the emission signal.

The above described and other features are exemplified by the following figures and detailed description.

BRIEF DESCRIPTION OF THE DRAWINGS

Referring to the exemplary drawings wherein like elements are numbered alike in the several Figures.

DETAILED DESCRIPTION OF THE PREFERRED EMBODIMENTS

Figure 1:
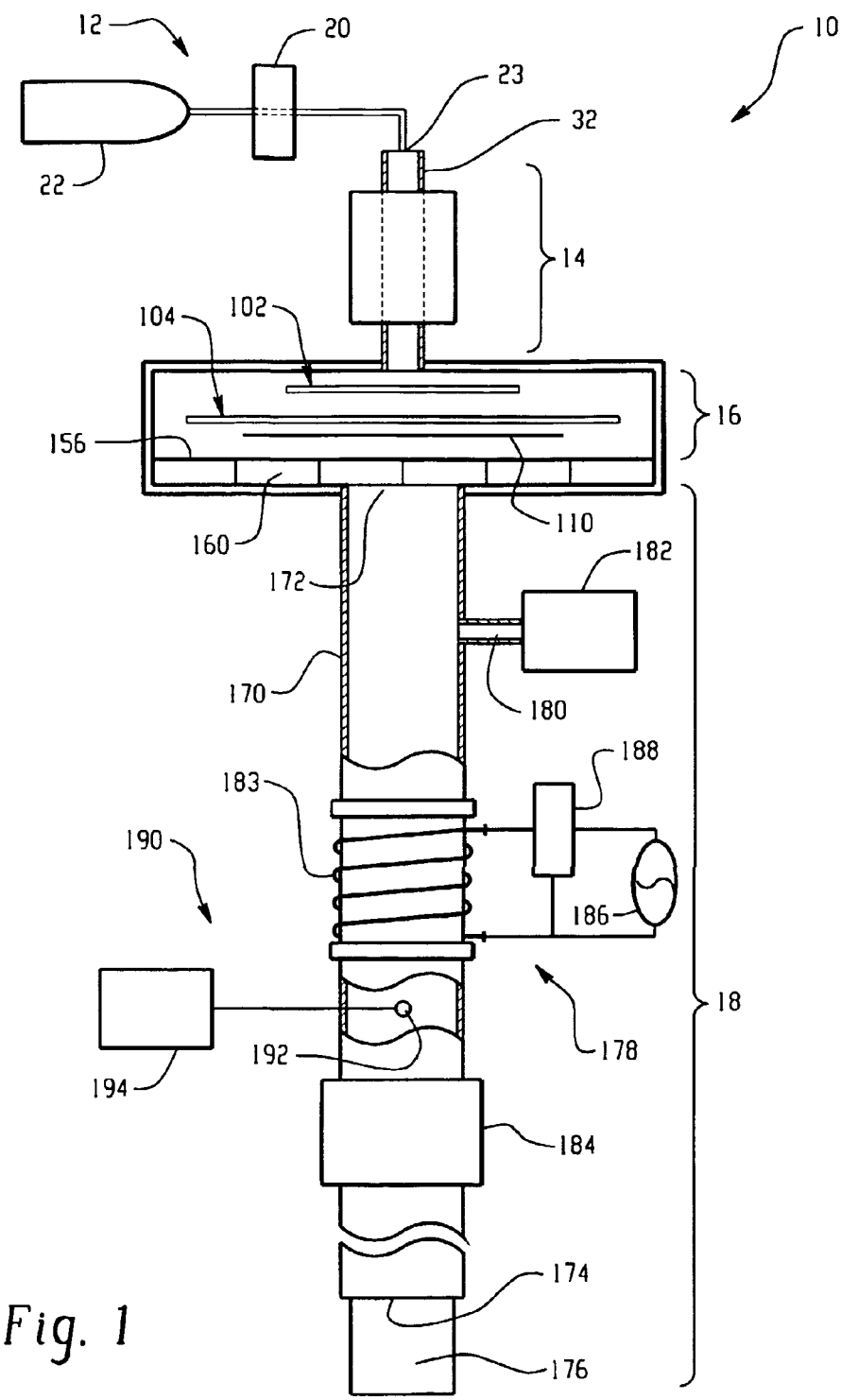
FIG. 1 is a cross sectional view of a downstream plasma ashing apparatus.

FIG. 1 generally illustrates an axial flow downstream plasma apparatus 10 suitable for use in removing photoresist, sidewall deposits, and post etch residues from substrates including low k dielectric materials. The plasma apparatus 10 generally comprises a gas delivery component 12, a plasma-generating component 14, a processing chamber 16, and an exhaust assembly component 18. The various components, in combination, provide unexpected improvements, for example, in processing substrates with oxygen free and nitrogen free plasmas, wherein the substrates include carbon containing low k dielectric materials.

Downstream axial flow plasma apparatuses particularly suitable for modification in the present disclosure are plasma ashers, such as for example, those microwave plasma ashers available under the trade name Fusion ES and commercially available from Axcelis Technologies Corporation. Portions of the microwave plasma asher are described in U.S. Pat. Nos. 5,498,308 and 4,341,592, and PCT International Application No. WO/97/37055, herein incorporated by reference in their entireties. As will be discussed below, the disclosure is not limited to any particular plasma asher in this or in the following embodiments. For instance, an inductively coupled plasma reactor can be used.

Carbon containing low k dielectrics are hereinafter defined as those carbon containing insulating materials suitable for use in the manufacture of integrated circuits or the like having a dielectric constant less than about 3.5. The carbon-containing low k dielectric materials may include pendant groups that contain carbon or may be carbon based wherein the backbone of the dielectric material is primarily comprised of an interconnecting network of carbon. Carbon containing low k dielectrics can generally be categorized as one of two types: organic and doped oxides. Examples of organic low k dielectric materials include polyimides, benzocyclobutene, parylenes, diamond-like carbon, poly (arylene ethers), cyclotenes, fluorocarbons and the like, such as those dielectrics commercially available under the trademarks SiLK, or BCB. Examples of doped oxide low k dielectric materials include methyl silsesquioxane, hydrogen silsesquioxanes, nanoporous oxides, carbon doped silicon dioxides, and the like, such as, for example, those dielectrics commercially available under the trademarks CORAL, BLACK DIAMOND and AURORA. Both types of carbon containing low-k materials exist in dense and porous versions. Porous versions thereof are commercially known under trademarks such as LKD, ORION, BOSS, or porous SiLK. Other carbon containing low k dielectric materials will be apparent to one of ordinary skill in the art in view of this disclosure.

Likewise, hydrogen containing low k dielectrics are hereinafter defined as those hydrogen containing insulating materials suitable for use in the manufacture of integrated circuits or the like having a dielectric constant less than about 3.5. Many of the carbon containing low k dielectrics described above include one or more hydrogen atoms attached to the carbon atoms within its chemical structure. However, suitable hydrogen containing low k dielectric materials in the present disclosure are not intended to be limited to carbon containing structures.

As shown in FIG. 1, the gas delivery component 12 preferably comprises a gas purifier 20 in fluid communication with a gas source 22 (for generating the oxygen free and nitrogen free plasma) and a gas inlet 23 of the plasma-generating component 14. An additional gas source (not shown) may be in fluid communication with the gas inlet 23 for providing in situ cleaning capabilities. In a preferred embodiment, the purifier 20 is adapted to reduce the level of impurities to less than about 20 parts per million (ppm), with impurity levels less than about 5 ppm more preferred, with impurity levels less than about 1 ppm more preferred, and with less than about 100 parts per billion (ppb) most preferred. Suitable purifiers achieving these impurity levels include those based on a metal gettering technology such as those gas purifiers commercially available under the trade name MONO TORR® high flow purifiers from SAES Pure Gas, Inc. The use of the gas purifier 20 in fluid communication with the gas source 22 employed for forming the plasma reduces the level of contaminants to amounts effective for robust processing of low k dielectric substrates, and in particular, carbon containing low k dielectrics. Suitable gases for generating the oxygen free and nitrogen free plasma include, but are not intended to be limited to, hydrogen, helium, argon, neon, other inert gases, hydrocarbons, and combinations comprising one or more of the foregoing gases. For example, a helium gas source having a reported purity of 99.999% can be undesirable for plasma mediated processing of carbon based low k dielectrics. Impurities such as $H_2O$, $O_2$, $CO$, $CO_2$, and $N_2$, can be at levels sufficient to cause erosion of the low k dielectric during further processing of the substrate and/or deleteriously cause an increase in the dielectric constant. Preferably, the incoming gas for forming the plasma is purified to contain less than about 20 ppm of $H_2O$, $O_2$, $CO$, $CO_2$, and $N_2$. The purifier 20 is preferably selected to be efficient and provide these preferred impurity levels at relatively high flow rates, e.g., flow rates of about 1000 to about 12,000 standard cubic centimeters per minute (sccm) or more can be expected for a 300 mm downstream plasma asher. 200 mm systems require proportionately smaller flow rates.

Figure 2:
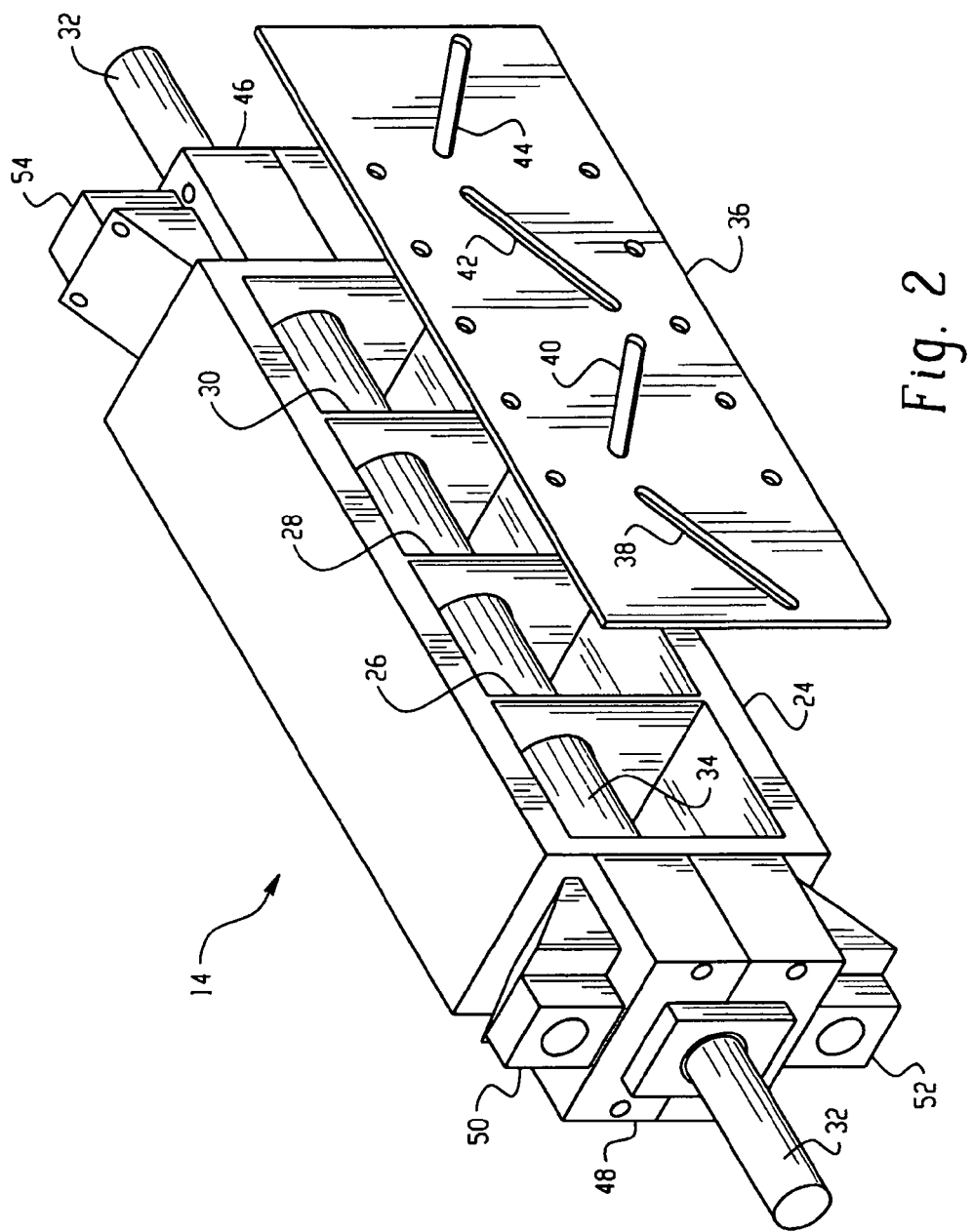
FIG. 2 shows a perspective view of a microwave enclosure for use in a plasma asher apparatus.
Figure 3:
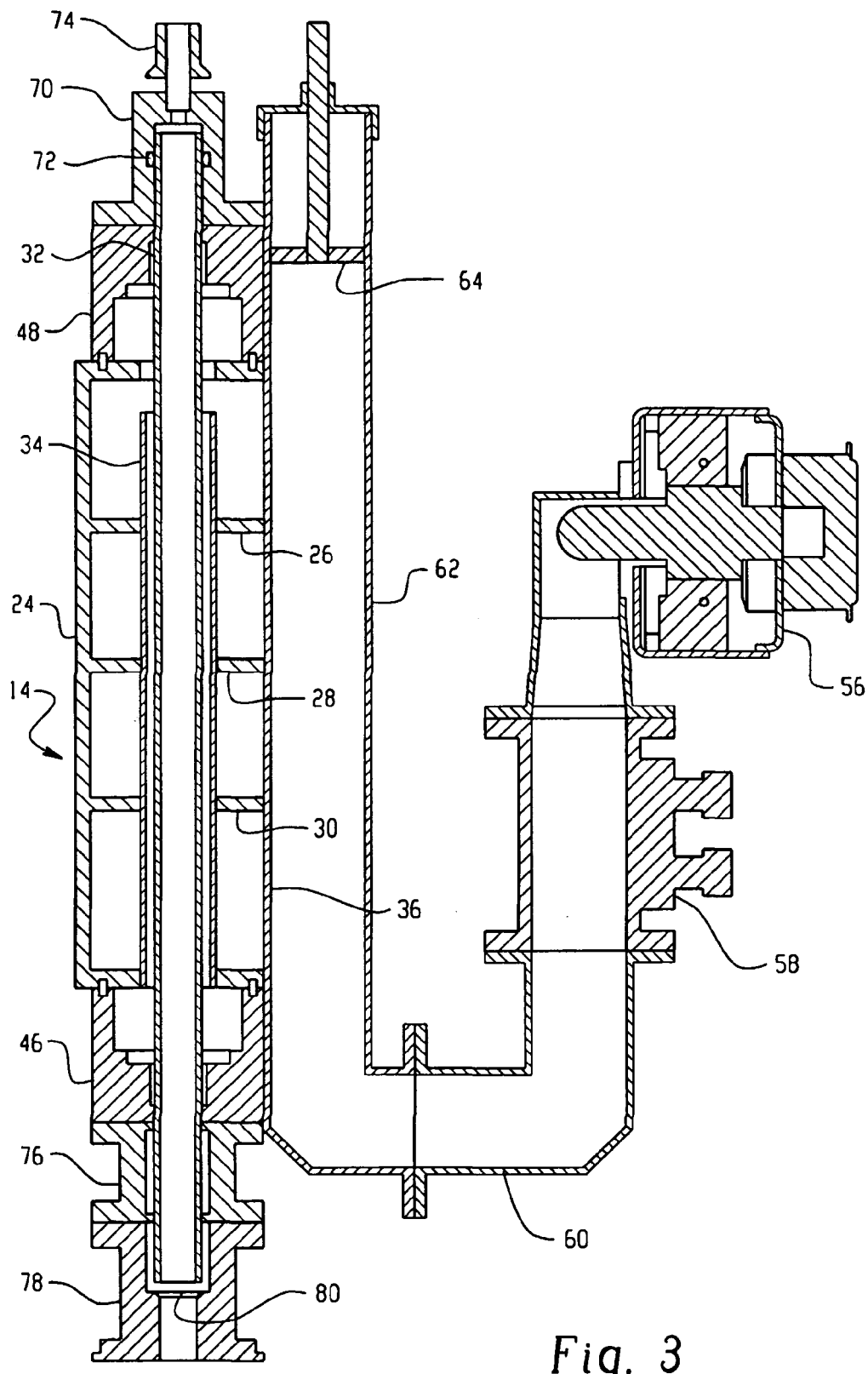
FIG. 3 shows a cross sectional view which schematically shows a plasma generating component suitable for use with the downstream plasma ashing apparatus.
Figure 4:
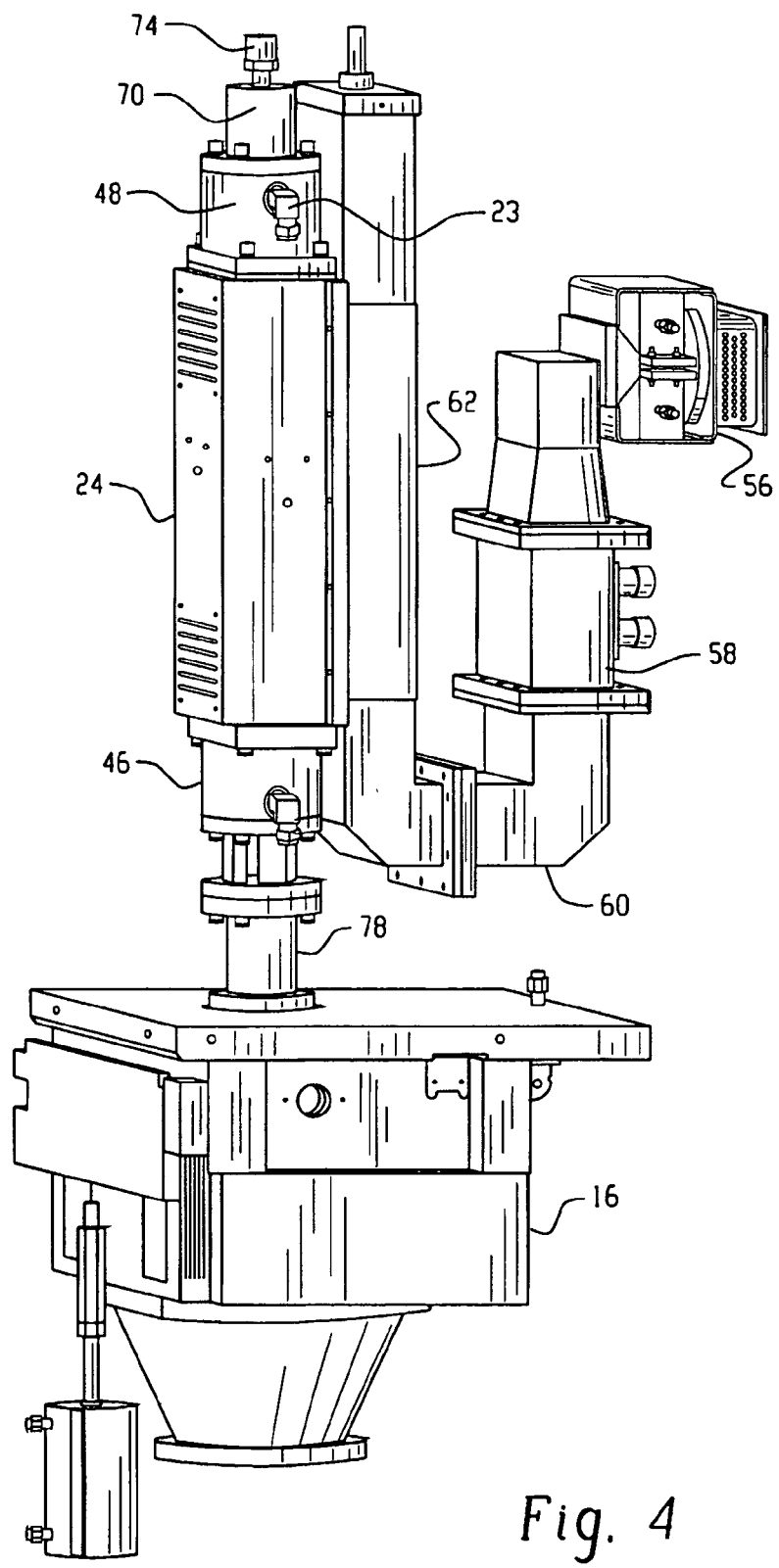
FIG. 4 shows perspective view of the plasma ashing apparatus.

FIGS. 2 and 3 illustrate an exemplary microwave plasma-generating component 14 with which the present disclosure may be practiced. FIG. 4 illustrates a perspective view of the plasma ashing apparatus 10 including the microwave plasma-generating component and a perspective view of the process chamber 16. It is to be understood that the plasma-generating component 14 has been simplified to illustrate only those components that are relevant to an understanding of the present disclosure. Those of ordinary skill in the art will recognize that other components may be required to produce an operational plasma ashing apparatus 10. However, because such components are well known in the art, and because they do not further aid in the understanding of the present disclosure, a discussion of such components is not provided.

The microwave plasma-generating component 14 includes a microwave enclosure 24. The microwave enclosure 24 is a rectangular box that is partitioned into lengthwise sections 26, 28, and 30 having plasma tube 32 passing therethrough. Each partition has an opening through which the plasma tube passes. Each section is fed with microwave energy during operation. Thus, each section appears to be a relatively short cavity to the incoming microwave energy, promoting the formation of modes having azithumal and axial uniformity. Outer tube 34 surrounds the plasma tube inside the cavity. The outer tube is slightly separated from the plasma tube and air, under positive pressure, is fed between the two tubes to provide effective cooling of the plasma tube. Tube 34 is preferably made of sapphire. Other plasma tube materials such as quartz, alumina-coated quartz, or ceramics can be used. Preferably, the microwave enclosure 24 is dimensioned to support the rectangular TM 110 mode and the enclosure 24 may have a square cross section. The dimensions of the cross sections are such that the TM 110 mode is resonant. The length of each section is less than $\lambda g/2$ where $\lambda g$ is the guide length within the cavity of the TE 101 mode.

The openings in the partitions 26, 28, and 30 through which the concentric tubes are fed are made larger than the exterior dimension of the plasma tube. Also shown is an iris plate 36, which covers the open side of the microwave structure and is effective to feed microwave energy into adjacent sections. Plate 36 is a flat metallic plate having irises 38, 40, 42, 44, through which the microwave energy is fed. By design, there is limited microwave transmission through such irises, due to using radial transmission line traps. These traps assure consistent boundary conditions to the top and bottom surfaces of each partition. If an outer tube is not used (cooling provided in some other manner) the openings in the partition are sized so that there is a space between the plasma tube and the partition to provide such microwave transmission.

Microwave traps 46 and 48 are provided at the ends to prevent microwave transmission. Such traps may be of the type disclosed in U.S. Pat. No. 5,498,308. Air seals/directional feeders 50 and 52 are provided for admitting cooling air and feeding it to the space between the concentric tubes. Air seals/directional feeder 54 are shown at the outlet end and a fourth such unit is present but is not seen.

Magnetron 56 provides microwave power that is fed through coupler 58 to a waveguide supplying TE 10 mode, having mutually perpendicular sections 60 and 62. The length of waveguide section 62 is adjustable with moveable plunger 64. The bottom plate of waveguide section 62 is iris plate 36, which couples microwave energy into partitioned microwave structure 24, through which the plasma tube 32 extends; thus plasma is excited in the gas mixture flowing through the plasma tube.

Referring again to FIG. 3, it is seen that end cap 70 abuts microwave trap 48, and fitting 74 having a central orifice for admitting gas to the plasma tube extends into the end cap. The gas supply 22 is regulated by an external flow box (not shown). The gas purifier 20 is disposed in fluid communication with the gas supply 22 and the gas inlet 23 (see FIG. 1). The plasma tube 32 is supported at this end by "o" ring 72 in the end cap. The outer tube 34 is supported at its ends by abutment against microwave traps 46 and 48. Spacer 76 is present to provide the proper spacing in relation to the process chamber. The other end of the plasma tube is located in end member 78, and has an opening 80 for emitting plasma/gas into the process chamber 16. Optionally, the conduit forming the opening 80 is fitted with a narrow aperture fitting to create a pressure differential between the plasma tube 32 and the processing chamber 16, wherein the pressure is greater in the plasma tube 32. During operation, the pressure within the plasma tube 32 preferably ranges from about 1 torr to about atmospheric pressure. In contrast, the pressure within the process chamber during operation ranges from about 100 millitorr to about atmospheric pressure.

The opening 80 of the plasma tube 32 is in fluid communication with an interior region of the process chamber 16. Since the plasma is discharged from a relatively narrow orifice (compared to the dimensions of the substrate to be processed) into the interior of the process chamber, a gas distribution system 100 to promote uniform plasma exposure onto the substrate is disposed within the process chamber 16. The gas distribution system 100 is disposed intermediate to the substrate and opening 80 of the plasma tube 32.

In a preferred embodiment, the gas distribution system 100 comprises one or more baffle plates above the wafer to promote even distribution of the plasma to the substrate surface. The baffle plates preferably include multiply stacked baffle plates, wherein each plate contains one or more apertures. In an especially preferred embodiment, the baffle plate assembly is adapted to provide more uniform reactivity of reactive species in the plasma. As discussed in the background section, it has been discovered that hydrogen radicals, for example, within a plasma, decrease in ashing efficiency as the hydrogen radicals travel from the center most impingement point in the axial flow reactor to the outer edges of the baffle plate. While not wanting to be bound by theory, it is believed that the reduction in activity of hydrogen radicals as these species flow to the outer edges of the baffle plate may be from a combination of two effects. First, in an axial flow reactor design such as the downstream plasma apparatus described herein, the photoresist ashing byproducts and spent gas from the central portions of the wafer must flow past the edge of the wafer in order to reach the exhaust conduit 170 of the process chamber 16. This results in significant dilution of the active hydrogen radicals nearer the edge of the wafer compared to the more central portions and additionally provides more opportunities for the radicals closer to the edge to deactivate by reacting with the photoresist ashing byproducts that have been removed from the more central locations. Second, because the distance to the edge is greater than the distance to the center it is more likely for the hydrogen radicals to deactivate from a process such as recombination to molecular hydrogen species. It has been discovered that better uniformity of ash rate can be achieved distally from the centerpoint of the baffle plate to the outer edges by increasing the aperture density of the baffle plate. For example, by increasing the aperture density from the centerpoint to the outer edges or by increasing the size of the apertures from the centerpoint of the baffle plate to the outer edges, or by including an apertureless centerpoint, or by a combination of one or more of the foregoing baffle plate configurations can increase reactivity and improve plasma uniformity at the substrate.

Figure 5:
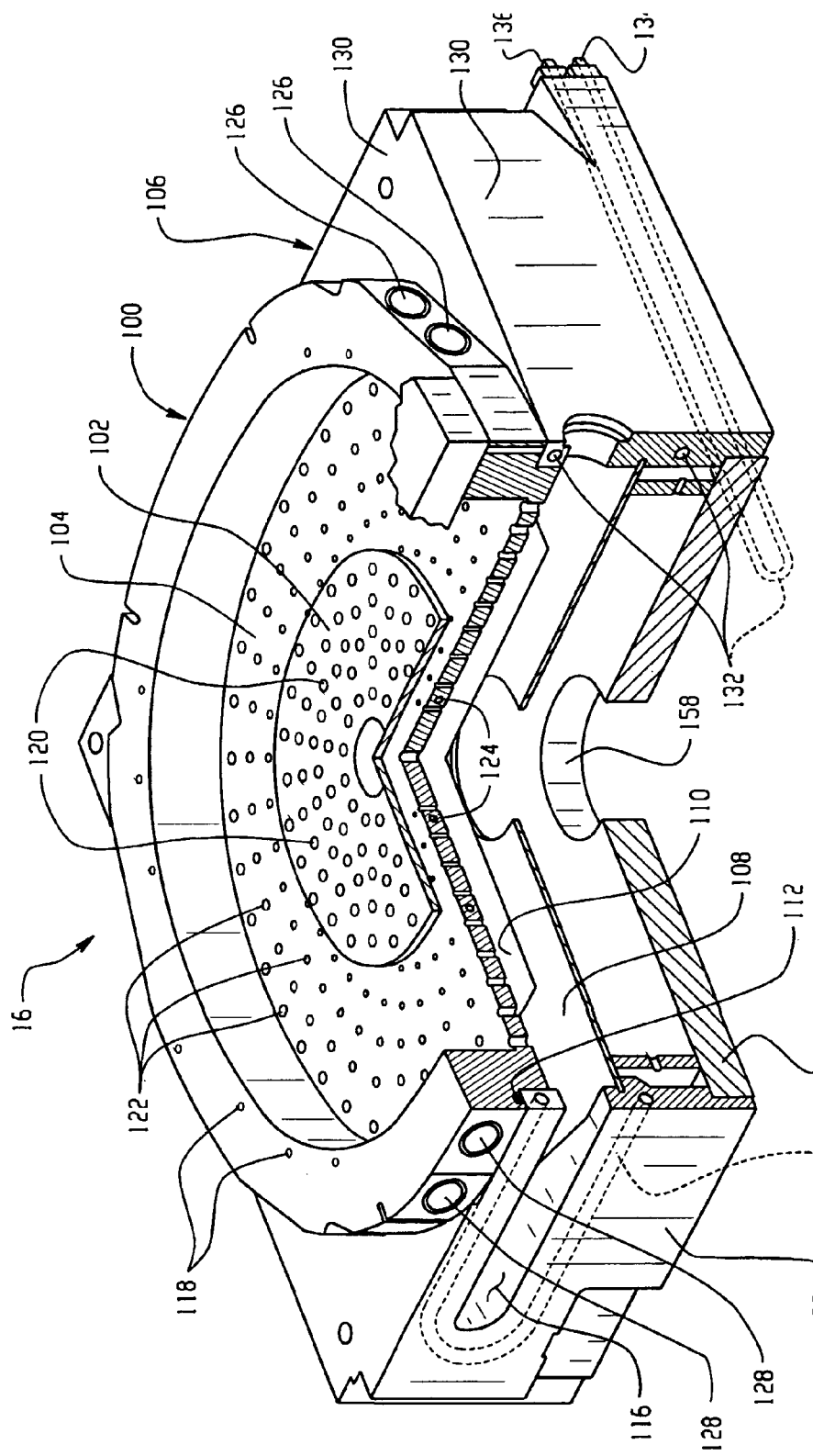
FIG. 5 is a partial cutaway perspective view of a photoresist asher process chamber into which is installed a gas distribution system.

FIGS. 5-8 illustrate suitable gas distribution systems for use in the apparatus 10. In a preferred embodiment, the gas distribution system 100 is a dual baffle plate assembly. FIG. 5 shows the process chamber 16 into which is incorporated a first embodiment of the gas distribution system or baffle plate assembly 100. The asher process chamber 16 having the baffle plate assembly 100 installed therein is suitable for use in a 300 millimeter (mm) wafer processing system. The gas distribution system 100 could also be adapted for use with 200 mm wafers, as would be appreciated by one of ordinary skill in the art in view of this disclosure. Moreover, although the gas distribution system 100 described herein is shown as being implemented within a downstream plasma asher apparatus, it may also be used in other semiconductor manufacturing equipment, such as residue removal, stripping, and isotropic etching equipment.

The baffle plate assembly 100 comprises an upper apertured baffle plate 102 and a relatively larger lower apertured baffle plate 104 positioned generally parallel to each other and separated from one another. The baffle plate assembly 100 is attached to a lower portion 106 of the process chamber that includes a cavity 108 in which a wafer 110 to be processed is placed. The baffle plates 102 and 104, in addition to being oriented parallel to each other, are also oriented parallel to the wafer 110 being processed.

Figure 7:
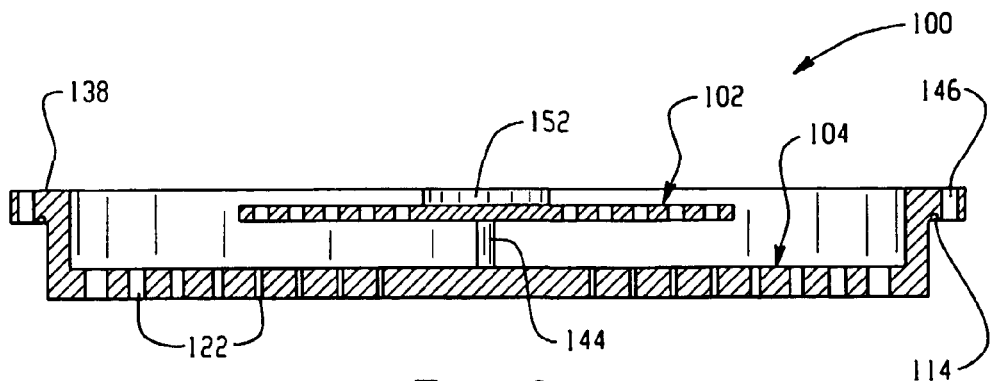
FIG. 7 is a sectional view of the baffle plate assembly of FIG. 6, taken along lines 7-7.

A seal 112 is provided at the interface between the baffle plate assembly 100 and the upper portion 106 of the process chamber, and resides within groove 114 in the lower baffle plate 104 (see FIG. 7). Wafers are introduced into and removed from the process chamber via a load lock mechanism (not shown) via entry/exit passageway 116. A heater mechanism (discussed below), located under the lower portion 106 of the process chamber, heats the underside of the wafer 110 to a desired temperature during processing.

The process chamber 16 is typically installed within the plasma ashing apparatus 10 intermediate to the heater assembly (below) and plasma-generating component 14 (above) at the locations of holes 118. During operation, energized plasma (gas) leaving the relatively narrow orifice of the plasma tube 32 (see FIG. 3) encounters the baffle plate assembly 100. In a preferred embodiment, the energized plasma flowing from the plasma tube 32 first encounters a central area of upper baffle plate 102 that is substantially free of apertures. This central apertureless area has the function of eliminating the high axial gas velocity exiting the plasma tube 32 and accelerating the gas/plasma species in a radial direction in order to achieve proper operation of the plenum formed between the lower baffle plate 104 and the lid of the chamber. The plasma is then distributed into the process chamber cavity 108 via apertures 120 in the upper baffle plate 102 and apertures 122 in the lower baffle plate 104. In one embodiment, the lower baffle plate 104 may be actively cooled with a cooling medium flowing through internal cooling passages 124 via inlets 126 and outlets 128. The walls 130 of the lower portion 106 of the process chamber may also be actively cooled with a cooling medium flowing through internal cooling passages 132 via inlet 134 and outlet 136.

Figure 6:
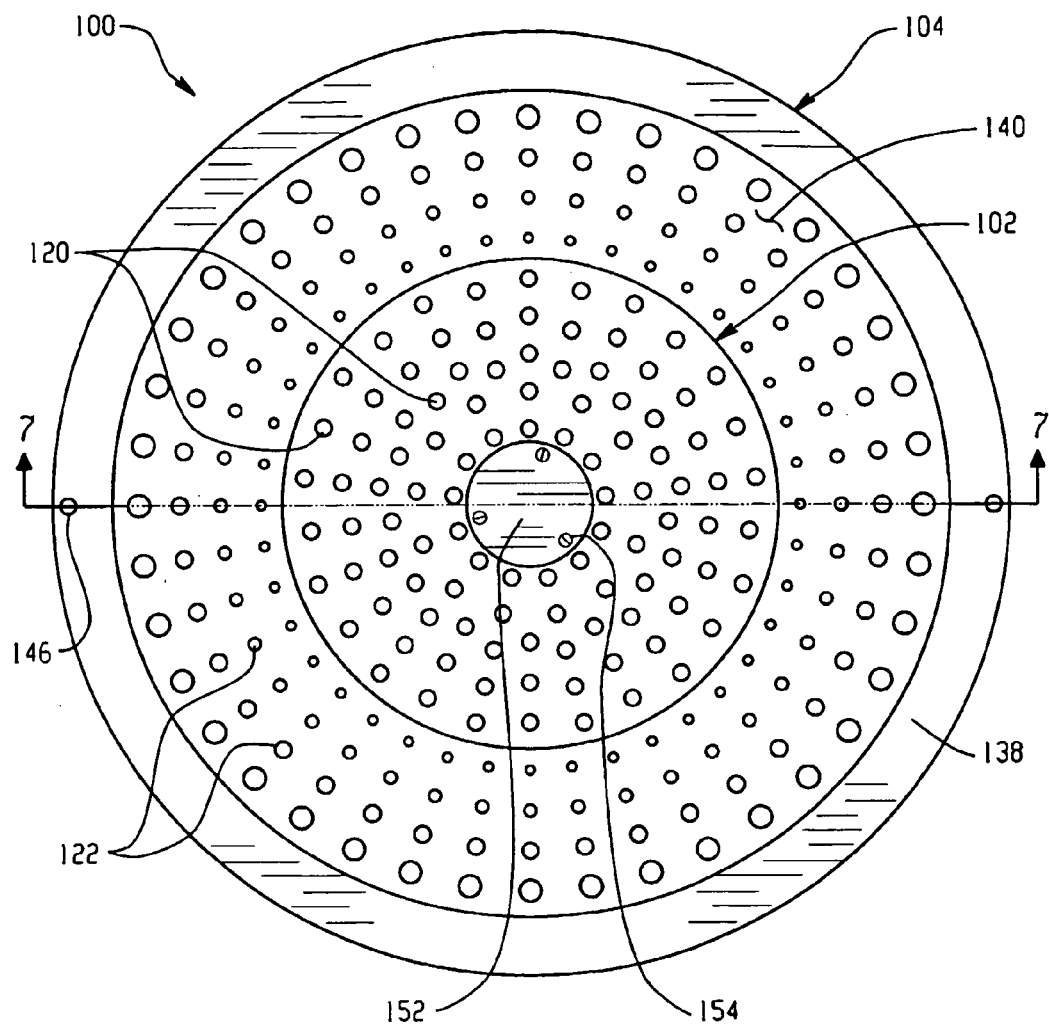
FIG. 6 is a plan view of the gas distribution system in accordance with one embodiment.

The lower baffle plate 104, as shown more clearly in FIGS. 6 and 7, comprises an outer flange 138 and a generally planar portion 140 that contains the apertures 122. Mounting holes (not shown) may be provided in the lower baffle plate 104 for mounting the upper baffle plate 102 thereto by means of standoffs 144. The distance between the upper and lower baffle plates in part determines the pattern of gas flow through the baffle plate assembly 100. For a 300 mm plasma asher, the distance between the upper and low baffle plates, 102, 104, respectively, is preferably about 0.25 inches to about 2 inches, with a distance of about 0.5 to about 1.5 inches more preferred.

FIG. 6 is a plan view of the 300 mm baffle plate assembly shown in FIG. 5, and FIG. 7 is a sectional view of this embodiment of the baffle plate assembly 100. As shown in these figures, the baffle plate assembly 100 is mounted to the lower portion 106 of the process chamber via mounting holes 146 in the lower baffle plate flange 138. Apertures 122 are provided in the lower baffle plate. The surface area of apertured portion 122 is sufficient to cover the wafer 110 residing therebelow (see FIG. 5). In this embodiment, the size of the apertures 122 increases from a centerpoint of the lower baffle plate to an outer edge. The increasing size of the apertures 122 improves plasma uniformity for oxygen free and nitrogen free plasmas such as for use with carbon containing and/or hydrogen containing low k dielectrics.

Figure 8:
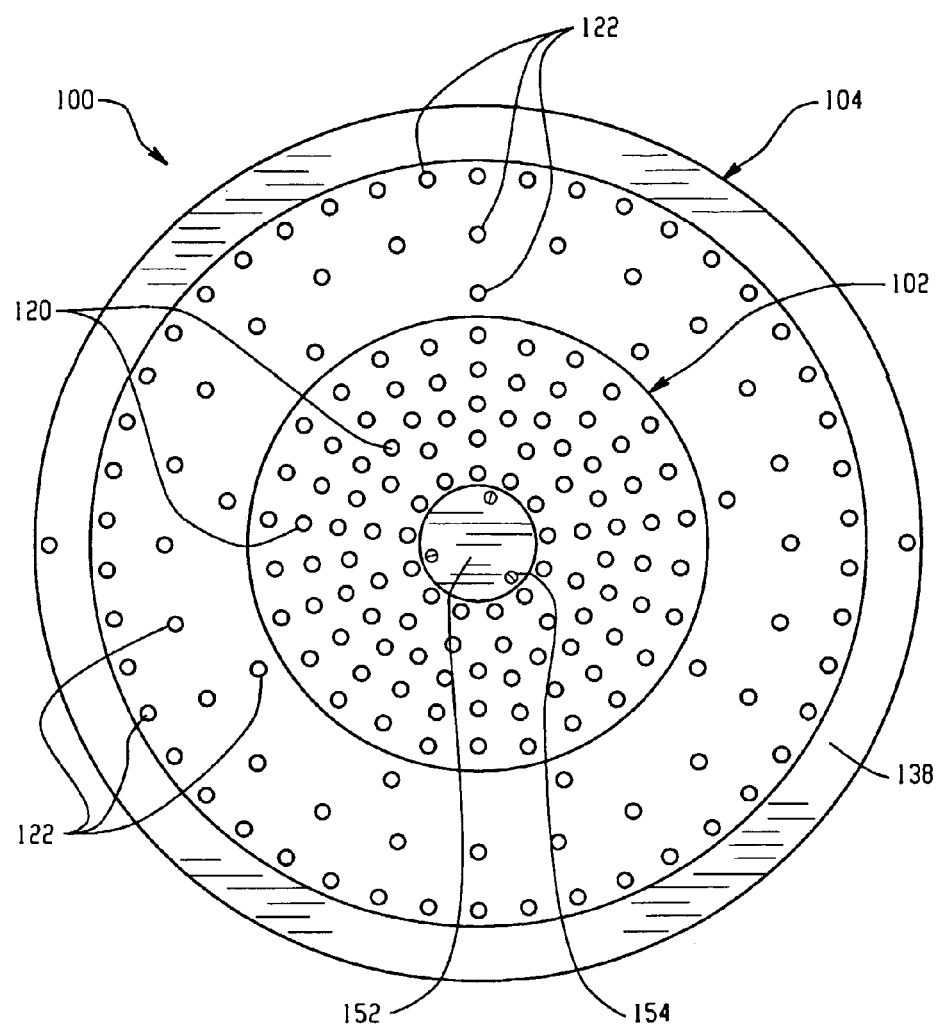
FIG. 8 is a plan view of the gas distribution system in accordance with another embodiment.

FIG. 8 illustrates a plan view of the lower baffle plate 104 in accordance with another embodiment. There, the density of the apertures 122 increases as one transitions from the center point of the lower baffle plate 104 to the outer edge, wherein the sizes of the apertures are the same. The lower baffle plate is preferably fabricated from quartz ($SiO_2$), sapphire coated quartz, sapphire, ceramic, or anodized aluminum.

The apertures 120 in the upper baffle plate 102 are generally arranged in a radial or concentric multiply circular pattern. The upper baffle plate 102 is comprised of sapphire-coated fused silica, quartz, sapphire, OF a ceramic material. The apertures 120 in the upper baffle plate 102 are preferably slightly larger than the largest apertures 122 in the lower baffle plate 104. Located at the center of the upper baffle plate, 102 is preferably an area free of apertures that may additionally comprise a sapphire, quartz or ceramic impingement plate 152, which can be secured to the upper baffle plate by screws 154, for example. The center apertureless portion of upper baffle plate 102 with or without the impingement disk 152 diverts energized gases emanating from the plasma tube 32 radially outward to the remaining apertured area of the upper baffle plate 102, so as to prevent the radially inward portion of the wafer 110 being processed from overheating, and thereby ashing at a proportionately higher rate than the rest of the wafer. In an alternative embodiment, the upper baffle plate 102 can be configured to be apertureless, preferably for processing 200 mm wafers.

Heating of the substrate 110 is preferably accomplished by an array of tungsten halogen lamps 160 (see FIG. 1) positioned below the wafer 110. A plate 156 (the bottom wall of the process chamber as shown in FIG. 5) transparent to visible and/or infrared radiation is disposed between the chamber 16 and the lamps 160. Preferably, the substrate is heated from about 80° centigrade (C) to about 350° C. during ashing. More preferably, the substrate is stepwise heated by incrementally increasing the temperature. Heating has been found to increase the reaction rate of the plasma with the photoresist and/or post etch residues and consequently, increase throughput. The amount of heat applied to the substrate will depend on the thermal stability of the particular low k dielectric layer as well as the other layers and components already formed in the substrate. In a preferred embodiment, the amount of heat is applied non-uniformly to selected zones of the substrate to facilitate uniform reaction of the plasma with the photoresist. In this embodiment, a controller (not shown) is in operative communication with the lamp array 160 for variously heating the substrate 110 to promote more uniform heating of the wafer during processing. An alternative method of heating the wafer is to use a flat heated surface in contact or close proximity to heat the wafer, commonly referred to as a chuck.

The substrate 110 is preferably exposed to heat of sufficient intensity and duration to cause volatile contaminants to diffuse out of the low-k dielectric layer and volatize without causing degradation of any other components or layers in the substrate. Preferably, for porous or non-porous doped oxide carbon containing low k dielectric materials the wafer is heated from about 20° C. to about 400° C., with about 100° C. to about 300° C. more preferred. Preferably, for organic low k materials the wafer is heated from about 80° C. to a maximum of about 180° C. The maximum temperatures for organic dielectrics are dependent on the intrinsic properties of the organic low k material used and can be determined by thermal analysis techniques known to those skilled in the art. The temperature may be step-wise increased during processing or remain static throughout the drying process.

Additionally, the process chamber 16 includes an exhaust opening 158 centrally disposed in the bottom plate 156. Preferably, the exhaust opening 158 is coaxial with the plasma tube 32.

The operating pressures within the process chamber 16 are preferably about 100 millitorr to about 3 torr, with about 200 millitorr to about 2 torr more preferred, and with about 500 millitorr to about 1.5 torr even more preferred. Moreover, the process chamber 16 may further include additional features depending on the application. For example, a quartz window may be installed and a UV light source may be placed in proximity to the wafer. Such a non-columnar light source may have a wavelength similar to UV excimer lasers that have been shown to enhance photoresist removal in bulk strip applications and as such, could be used in parallel with microwave plasma generated reactive gases. Moreover, pre- and post-photoresist strip exposure to the light source could also provide residue removal and implanted resist removal advantages. Overhead RF sources, optical ports, gas analyzers, additional light sources, and the like could also be used either independently, or in combination, with the process chamber 16 providing an extremely flexible process platform.

Coupled to the process chamber 16 is the exhaust assembly component 18. The exhaust assembly component 18 includes an exhaust conduit 170 in fluid communication with an interior region of the process chamber 16. An inlet 172 of the exhaust conduit 170 is fluidly attached to opening 158 in the bottom plate 156 of the process chamber 16. The exhaust conduit 170 preferably has a substantially straight shape from inlet 172 to outlet 174, thereby minimizing high impact areas (e.g., sharp bends and curves in the conduit) and the propensity for buildup of photoresist material and plasma ashing byproducts at sharp bends. In a preferred embodiment, the exhaust conduit 170 is fabricated from quartz. A minimum diameter of the exhaust conduit 170 (and opening 156) is preferably at least about 2 inches for a 300 mm ashing apparatus (about a 1.5 inch diameter or greater is preferred for a 200 mm plasma ashing apparatus). By centrally locating the exhaust conduit 170 within the process chamber 16, flow from the plasma tube to the exhaust assembly is simplified and provides greater plasma uniformity.

The outlet 174 of the exhaust conduit 170 is preferably connected to vacuum system 176. An afterburner assembly 178 is in operative communication with the exhaust conduit 170. A gas inlet 180 and gas source 182 are in fluid communication with the exhaust conduit 170 and are positioned upstream from the afterburner assembly 178. The afterburner assembly 178 is employed to generate a plasma discharge within the exhaust conduit 170 so as to volatilize photoresist material and byproducts discharged from the process chamber 16. As will be described in greater detail below, the gas source 180 is preferably a non-halogen based oxidizing gas such as oxygen. It is preferred that the oxidizing gas is introduced to the afterburner assembly immediately above the RF coils and spacedly apart (i.e., downstream) from the exhaust opening 158 of the process chamber 16. Entry of oxygen into the process chamber 16 can deleteriously affect the low dielectric material in the manner previously described and the hardware and process are designed to circumvent this.

The afterburner assembly 178 generally comprises an RF coil 183 wrapped about an exterior of the exhaust conduit 170 to inductively excite a gas mixture flowing through the exhaust conduit 170. The oxidizing gas is preferably introduced at inlet 180 upstream from the afterburner assembly 178. The RF coil can be replaced by a microwave source for generating plasma with similar results. A throttle valve 184, foreline valve (not shown), vacuum pump 176, and other vacuum processing lines are disposed downstream from the afterburner assembly 178.

The RF coils 183 are connected to a suitable RF generator or power supply 186. The power supply frequency may vary, typically ranging from 400 KHz to the preferred value of 13.56 MHz at less than 1 kilowatt, but may also be at higher frequencies and higher power. More preferably, an RF power of 300 watts (W) to 500 W is employed to inductively couple an oxygen species containing plasma in the exhaust conduit 170, which causes the organic matter contained therein to combust. As a result, deposition of photoresist material and plasma byproducts downstream from the process chamber is prevented and/or removed.

The RF connections are typically made through an RF matchbox 188 and the coils 183 are energized at the beginning of the plasma ashing process. The oxygen containing ($O_2$) gas admixture passing through the coupled RF field produces a plasma that effectively and efficiently combusts organic matter. Preferably, the afterburner assembly 178 is configured to simultaneously operate during plasma ashing processing of a substrate 110 in the process chamber 16.

Additionally, the exhaust conduit 170 also includes an optical detection system 190. The optical detection system 190 optically detects emission signals having particular wavelength ranges that correspond to the reactants and byproducts of the reaction between the plasma and the photoresist. The technique relies on detecting the change in the emission intensities of characteristic optical radiation from the reactants and by-products in the plasma. Excited atoms or molecules emit light when electrons relax from a higher energy state to a lower energy state. Atoms and molecules of different chemical compounds emit a series of unique spectral lines. The emission intensity for each chemical compound within the plasma depends partly on the relative concentration of the chemical compound in the plasma. A typical optical emission spectroscopy apparatus operates by measuring the emission intensities of the reactive species and the by-product of the reactive species and the photoresist. For instance, the emission of light by the by-product decreases and finally stops when an endpoint is reached. The optical emission spectroscopy apparatus senses the declining emission intensity of the by-product to determine this endpoint. Advantageously, optical signals from the regions downstream from the discharge region of the afterburner assembly 178 can be used to clearly indicate when the plasma is ignited. For example, an oxidizing agent such as oxygen is consumed when the plasma is ignited within the exhaust conduit 170 and combustion products are generated. The combustion products, e.g., carbon monoxide, carbon dioxide, water and the like, are those typically encountered during plasma ashing of photoresist with oxygen containing plasmas. Since these species emit strong optical emission signals, an oxygen free and nitrogen free plasma process can be readily monitored for endpoint detection by analyzing the optical signals produced in the exhaust conduit plasma discharge region. Once the signal of the monitored species is undetectable, it can be presumed that endpoint has been reached. As previously discussed, the use of oxygen free and nitrogen free plasma processes are desired for removing photoresist masks and the like from substrates containing carbon containing and/or hydrogen containing low k dielectrics. Suitable oxygen free and nitrogen free plasma processes for use in the present disclosure are disclosed in pending U.S. patent application Ser. No. 09/855,177, to Waldfried et al., incorporated herein by reference in its entirety. The present process and apparatus provides a means for endpoint detection, which otherwise is generally difficult to directly detect in a process chamber in view of the optically non-emissive species generated during an oxygen free and nitrogen free plasma ashing process.

The optical detection system 190 is coupled to the exhaust conduit. Collection optics 192 may be arranged outside the exhaust conduit 170 to collect the emission spectra thus passed. Since the exhaust conduit 170 is preferably fabricated from an optically transparent material such as quartz or sapphire, an optical port or window is not necessary. In the event that an optically non-transparent material is employed for the fabrication of the exhaust conduit, an optical port of quartz or sapphire may be formed in the exhaust conduit. A spectrometer or monochromator, (generally shown as 194 in FIG. 1) is arranged to receive light from the collection optics 192. Optical emission spectroscopy and techniques are generally well known on the art. In one embodiment, the optical emission spectroscopy is by a spectrometer, such as a CCD (charge couple device) based spectrometer or a PDA (photodiode array) based spectrometer, that time sequentially records a wavelength range and converts the emission spectra into analog signals for subsequent analysis. Optionally, narrow band filters can be used to permit evaluation of specific ranges of the wavelength of interest on a light detector such as a PMT (photomultiplier tube) or a photodiode. The spectrometer time sequentially converts light signals emitted during the ashing process at specific wavelengths into an electrical analog signal, which can then be analyzed using methods known to those skilled in the art to produce a desired output. Preferably, the data is viewed in real time. Preferably, the data is viewed in graphical form showing the time evolution of the light intensity emitted during plasma processing for the wavelength range of interest.

Alternatively, other optical detectors can be used. For instance, as discussed above, a monochromator can be used to collect the data. As is known to those skilled in the art the monochromator can be configured with a photomultiplier tube, a photodiode or the like to record the emission signal.

These optical emission spectroscopy devices and suitable configurations within a plasma reaction chamber will be apparent to those skilled in the art in view of this disclosure. An example of a monochromator suitable for use in the present disclosure is model no. EP200MMD commercially available by the Verity Corporation. An example of a scanning monochromator suitable for use in the present disclosure is model no. EP200SMD commercially available by the Verity Corporation. Examples of CCD based spectrometers suitable for use in the present disclosure are Model Nos. SD1024 commercially available by Verity Corporation, and series PC2000 CCD spectrometers commercially available from Ocean Optics. An example of a photodetector array suitable for use in the present disclosure is model no. SPM9001 commercially available from the Prema Company, Germany.

Figure 9:
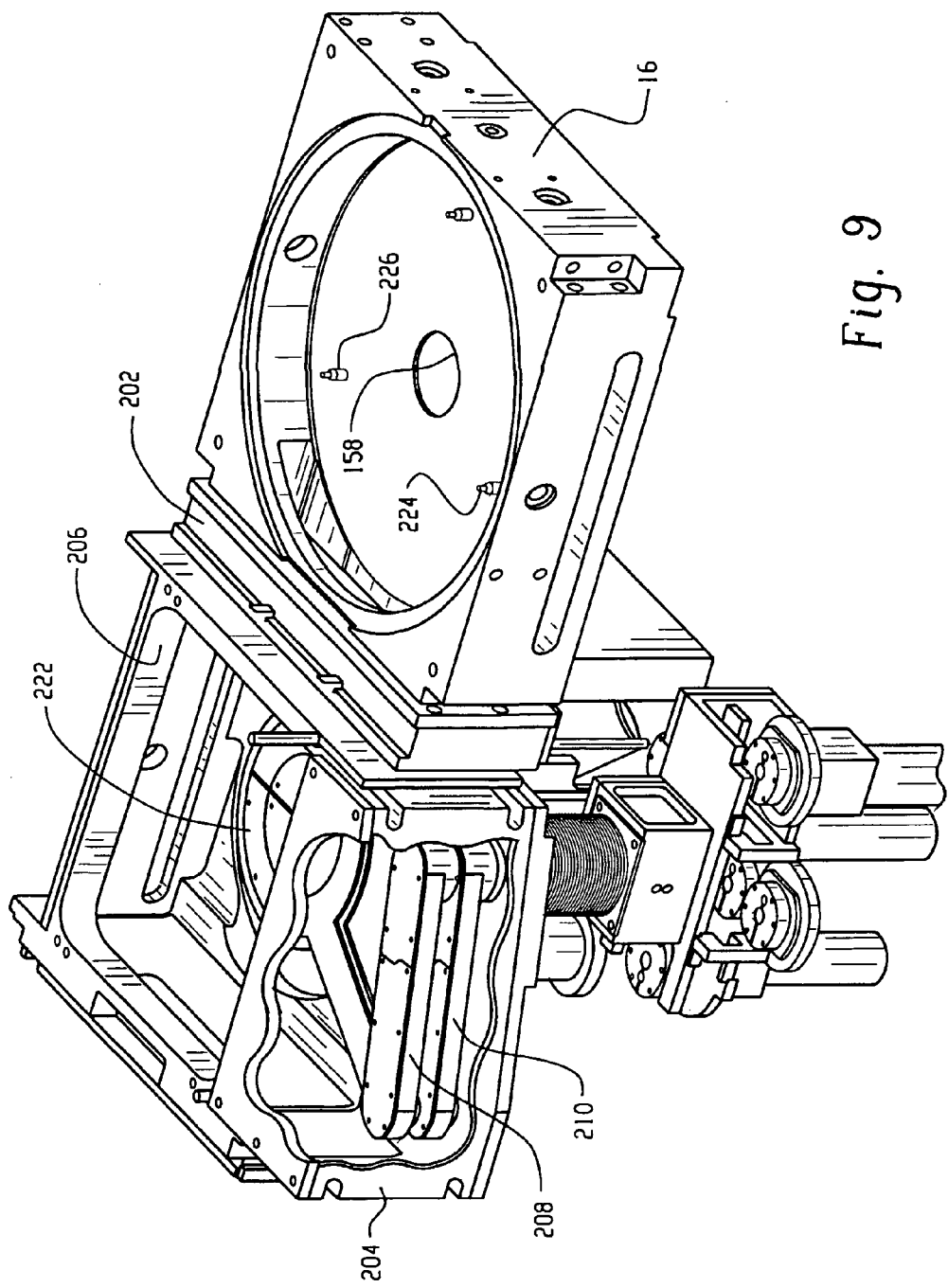
FIG. 9 is a perspective view of a loadlock chamber assembly and process chamber for a downstream plasma ashing apparatus.
Figure 10:
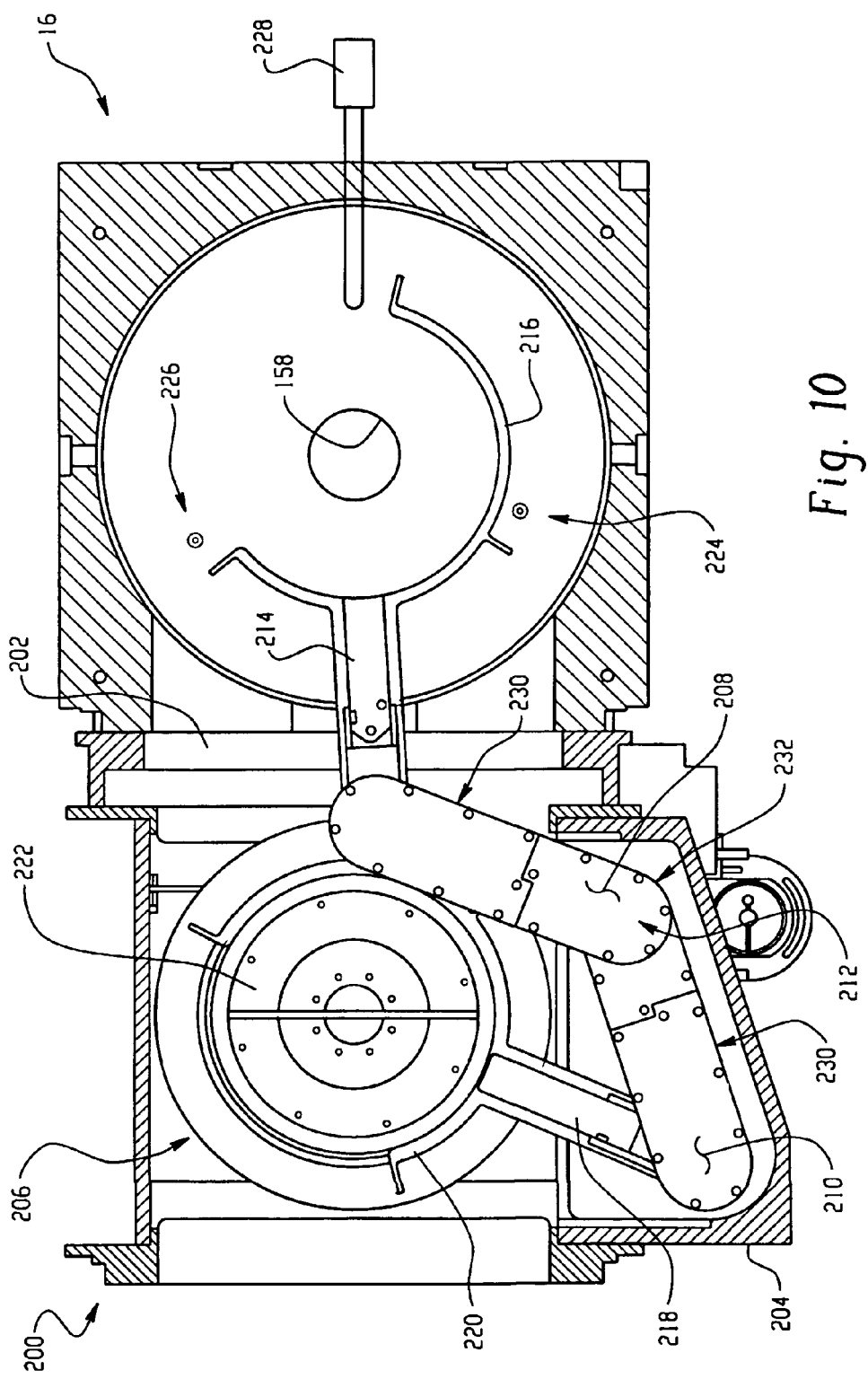
FIG. 10 is a top plan view of the loadlock chamber assembly and the process chamber of FIG. 9.

FIGS. 9 and 10 illustrate a loadlock chamber assembly 200 coupled to the process chamber 16. The loadlock chamber assembly 200 and the process chamber 16 are interconnected, wherein a closable vacuum sealed opening 202 is disposed and configured for permitting the exchange of wafers between the process chamber and the loadlock chamber assembly 200. The opening 202, as shown, is configured for permitting a single wafer to be passed therethrough. Alternatively, opening 202 may be sized and configured to allow two wafers to simultaneously pass through, e.g., a processed wafer exiting the process chamber and an unprocessed wafer entering the process chamber. The loadlock chamber assembly 200 generally includes a removable sub-chamber 204 and a chamber 206. The sub-chamber 204 is removably attached to a wall of the chamber 206 and preferably contains a dual end effector wafer transport mechanism such as described in U.S. patent application Ser. No. 09/905,031 to Kinnard et al., hereby incorporated by reference in its entirety. The dual end effector wafer transport mechanism robotically transports wafers into and out of the chambers 206 and 16 through opening 202. Since the articulating arms are housed in a removable sub-chamber 204 affixed to the loadlock chamber 206, the setup and repair of the robotic arms is simplified.

The dual end effector wafer transport mechanism includes an upper link arm 208 and a lower link arm 210 that share a common pivot axis 212 about which the arms articulate. The distal end of the tipper link arm 208 is pivotably connected to an upper translating arm 214 including an upper end effector 216 for holding a wafer or a substrate 110 (see FIG. 1). The arm 208 includes an elongated housing having a removable two-piece cover 230 and 232.

Similarly constructed, the distal end of the lower link arm 210 is pivotably connected to a lower translating arm 218 including a lower end effector 220. The arm 212 also includes an elongated housing having a removable two-piece cover 230 and 232. The use of dual end effectors 216 and 220 permits the loadlock chamber 206 to simultaneously contain two wafers at a midway point in the wafer exchange operation with the process chamber 16, thereby allowing high throughput. A cold plate 222 is mounted approximately in the center of the loadlock chamber 206, and may be manually adjusted in the x-y plane, if necessary. The process chamber 16 includes two wafer support pins (wafer pins) 224 and 226 for supporting a wafer 104 during processing. A thermocouple 193 provides additional support for the wafer and provides a means for measuring the temperature of the wafer.

Advantageously, the loadlock chamber provides a mechanism for cooling the substrate to below 100° C. Moreover, the loadlock chamber as described above does not require venting between wafers, which could potentially introduce contaminants to the substrate. As previously discussed, oxygen and nitrogen are detrimental to low k dielectric materials. Eliminating or minimizing contact with these gases is important to maintain the beneficial properties of the low k dielectric material.

Preferably, the plasma apparatus described above is used with substrates, wherein the low k materials contain carbon and/or hydrogen within its structure such as doped oxides, porous materials and organic low k films. The carbon-containing low k dielectric materials may include pendant groups that contain carbon or may be carbon based wherein the backbone of the dielectric material is primarily comprised of an interconnecting network of carbon. The process employing the nitrogen-free and oxygen-free plasma provides high ashing selectivity and overcomes the problems noted in the prior art that occur from ashing photoresist, polymers and residues from carbon and/or hydrogen based low k dielectric materials. Moreover, the process alleviates the subsequent metal filling problems caused by nitrogen in the ashing plasma.

The ashing process includes generating reactive species from a plasma gas mixture and exposing a substrate to the reactive species. The particular components of the plasma gas mixture are selected by their ability to form a gas and plasma under plasma forming conditions. The gas mixture selected is free from components that generate reactive oxygen species and reactive nitrogen species under plasma forming conditions. More preferably, the gas mixture is free from oxygen-containing compounds and nitrogen-containing compounds. The gas mixture may include a number of reactive gases that are hydrogen-bearing such as hydrogen and hydrocarbons. The gas mixture may further comprise an inert gas such as argon, helium, neon and the like. The plasma generated from the gas mixture primarily reacts with carbon and other atoms in the photoresist, polymers, and residues to form compounds that are volatile under the temperature and pressure conditions of the substrate and/or rinse removable compounds. The process is optimized to preferably have a selectivity greater than 50:1.

Hydrogen-bearing gases suitable for use in the process include those compounds that contain hydrogen. The hydrogen-bearing gases include hydrocarbons, hydrogen gas or mixtures thereof. Preferred hydrogen-bearing gases exist in a gaseous state under plasma forming conditions and release hydrogen to form reactive hydrogen such as atomic hydrogen species and other hydrogen radicals under plasma forming conditions. The hydrocarbons are generally unsubstituted. Examples of hydrogen-bearing hydrocarbon gases include methane, ethane and propane.

Preferred hydrogen-bearing gases are mixtures of a hydrogen-bearing gas and a noble gas. Examples of noble gases suitable for use in the process include a gas in Group VIII of the periodic table such as argon, neon, helium and the like. Although prior art oxygen-free plasmas generally use a forming gas composition that includes a hydrogen and nitrogen gas mixture, the use of nitrogen gas in the process is expressly excluded. Consequently, since forming gas is hereinafter defined as a gas containing a mixture of hydrogen and nitrogen gases, the use of forming gas in the process is expressly excluded. Particularly preferable for use in the present invention is a gas mixture that includes hydrogen and helium gases. Helium gas atoms are light and readily diffuse to the substrate, which results in excellent carrier characteristics for plasma generated reactive hydrogen species.

For safety reasons, the percentage of hydrogen gas in the gas mixture generally does not exceed about 5 percent by volume of the gas mixture. However, higher amounts of hydrogen are acceptable and sometimes preferred for increasing the photoresist removal rate and selectivity. Preferably, the amount of hydrogen in the gas mixture is from about 1 to about 99 percent of the total volume. More preferably, the amount of hydrogen in the gas mixture is from about 10 to about 30 percent of the total volume.

In operation, the semiconductor wafer 110 with photoresist and/or post etch residues thereon (and a carbon containing low k dielectric material) is placed into the process chamber 16 on wafer support pins. The wafer 110 is preferably heated by infrared lamps 160 to accelerate the reaction of the photoresist and/or post etch residues with the plasma. The pressure within the process chamber 16 is then reduced. Preferably, the pressure is maintained between about 1 torr to about 5 torr. An excitable oxygen free and nitrogen free gas mixture is fed into the purifier and then the plasma tube 32 of the plasma generating component 14 via a gas inlet 24. Each section 26, 28, 30 of the plasma generating component 14 is fed with microwave energy to excite a plasma in the plasma tube 32, which plasma is comprised of electrically neutral and charged particles. The charged particles are preferably selectively removed before the plasma enters the process chamber 16. The excited or energetic atoms of the gas are fed into the process chamber and distributed uniformly across the wafer to react with the photoresist and/or post etch residues, which causes removal of the photoresist material and also forms volatile byproducts. The photoresist material and volatile byproducts are continuously swept away from the wafer surface to the centrally located exhaust conduit 170.

Simultaneously with plasma ashing, a non-halogen oxidizing gas such as oxygen is fed into the exhaust conduit downstream from the process chamber 16. No oxygen enters the process chamber 16. The afterburner assembly 178 is energized to form high-density plasma within the exhaust conduit 170. For an exhaust conduit 170 configured with a CCD based spectrometer, the CCD spectrometer time sequentially records an emission spectrum that includes emission signals corresponding with the photoresist material and volatile byproducts, if present. The wavelength range of the emission spectrum monitored is determined by the type of CCD spectrometer used and the presence of any filters used to eliminate certain wavelength emissions from reaching the CCD spectrometer. The CCD spectrometer configuration simultaneously records the background radiation and the radiation from the emitted species during the ashing process. Using standard algorithms known to those skilled in the art, the background radiation can be subtracted from the radiation resulting from the reaction of the plasma with the photoresist and/or byproducts. Once the emission peak records a change in intensity values and the conditions set by the end-point algorithm are met, the removal of photoresist and/or residues is complete, a signal is then sent to a control unit and the plasma can be turned off. The vacuum is released and the processed wafers may be removed from the process chamber. An optional rinse is used to remove any remaining residue on the stripped wafer.

In a plasma asher with a monochromator, blank uncoated wafers are first exposed in the process chamber 16 and a first emission signal at a desired wavelength is measured. The first emission signal represents the background radiation as discussed above. Next, substrates having photoresist and/or residues thereon (and containing a carbon based low k dielectric material) are exposed to plasma in the process chamber. A second emission signal emitted at the desired wavelength is recorded in the exhaust conduit by the monochromator. The background radiation of the first emission signal is subtracted from the second emission signal. When the second emission signal at the desired wavelength reaches a steady state and is about the same or below the first emission signal, the ashing endpoint has been reached and a signal is then sent to a control unit in the plasma asher and the plasma is turned off. The vacuum is then released and the processed wafers are removed from the reaction chamber. An optional rinse is then used to remove any remaining residues on the stripped wafer.

Other monochromators, spectrometers or like configurations and operations thereof for monitoring the plasma byproducts discharged from the process chamber will be apparent to those skilled in the art in view of this disclosure. Preferably, the emission signals of about 283 nm, about 309 nm, about 387 nm, about 431 nm, about 434 nm, about 468 nm, about 472 nm, about 513 nm, about 516 nm, about 656 nm, about 777 nm, and about 841 nm (±about 5 to about 10 nm) are monitored in the exhaust conduit. These emission signals represent spectral peaks for photoresist materials and plasma byproducts formed by a mixture of photoresist components, oxygen free and nitrogen free upstream plasmas and downstream afterburner plasmas. In this manner, an oxygen free and nitrogen free plasma can be used to remove the photoresist material and post etch residues from substrates containing carbon based low k dielectrics whereas a second plasma, preferably oxidizing, is formed in the exhaust conduit 170 to determine ashing endpoint for the oxygen free and nitrogen free plasma.

Unless otherwise specified, the materials for fabricating the various components 12, 14, 16, and 18 include metals, ceramics, glasses, polymers, composite materials, and combinations comprising at least one of the foregoing materials. For example, suitable metals include anodized aluminum, and/or stainless steel. Suitable ceramic materials include silicon carbide, or aluminum oxide.

The following examples are presented for illustrative purposes only, and are not intended to limit the scope of the disclosure.

EXAMPLE 1

In this example, plasma uniformity was examined using different dual baffle plate configurations in a Fusion ES3 downstream microwave plasma asher commercially available from the Axcelis Technologies Corporation. Multiple 300 mm silicon wafers were coated with 0.75 microns of AZ1505 photoresist under identical conditions and exposed to a 4% hydrogen in helium plasma at 1.1 torr at the temperature indicated in Table 1. AZ1505 photoresist is commercially available by the Hoechst Corporation. The upper baffle plates were identical for each configuration. A control lower baffle plate consisting of 420 apertures evenly spaced across a 13" circular area was employed. Each aperture was 0.113 inches in diameter. Plasma uniformity for the control was compared to two different configurations in accordance with the teachings of the present disclosure. Configuration 1 consisted of 570 apertures evenly spaced across a 15-inch circular area. Apertures within a 5-inch radius from the center were 0.113 inches in diameter. Those apertures outside the 5-inch radius had a 0.141-inch diameter. Configuration 2 consisted of 420 apertures with increasing density from the centerpoint to the outer edge. The apertures had a diameter of 0.113 inches. In all cases, the distance between the upper and lower baffle plates was 0.5 inches and the distance between the substrate to the lower baffle plate was 0.5 inches. The time of exposure to the plasma was selected in order to remove approximately one half of the photoresist thickness. Non-uniformity was measured by determining thickness removed at 49 points across the substrate using conventional techniques and then dividing the standard deviation for the 49 points by the average value and expressing the result as a percentage. Results are shown in Table 1.

TABLE 1

| Baffle Plate Assembly | Processing Temperature (° C.) | Non-uniformity (%) |
|---|---|---|
| Control | 270 | 14.95 |
| Configuration 1 | 270 | 8.18 |
| Configuration 2 | 270 | 10.83 |
| Control | 330 | 9.61 |
| Configuration 1 | 330 | 3.43 |
| Configuration 2 | 330 | 7.38 |

The results show significant improvements in plasma ash uniformity by increasing density of the apertures and even more so by increasing the size of the apertures from the centerpoint of the lower baffle plate to the outer edge.

While the disclosure has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An axial flow downstream plasma treatment device for treating a substrate including a low k dielectric material, comprising, in combination:

a substantially oxygen and nitrogen free gas source;

a gas purifier intermediate to the gas source and the plasma-generating component adapted to reduce oxygen and nitrogen impurity levels to less than 20 parts per million;

a plasma generating component in fluid communication with the gas source, the plasma generating component comprising a plasma tube and a plasma generator coupled to the plasma tube for generating a substantially oxygen and nitrogen free plasma within the plasma tube from the gas source;

a process chamber in fluid communication with the plasma tube comprising a baffle plate assembly about an inlet of the process chamber, wherein the baffle plate assembly comprises a generally planar upper baffle plate fixedly positioned above a generally planar lower baffle plate, the upper baffle plate being smaller than the lower baffle plate such that the upper baffle plate is free from direct contact with other components defining the plasma processing chamber, the lower baffle plate comprising a plurality of apertures disposed about a central axis, wherein a dimension of each one of the plurality of apertures increases from the central axis to an outer edge of the lower baffle plate, and wherein the baffle plate assembly is positioned generally parallel to the substrate, wherein the substrate contains a low k dielectric material;

an exhaust conduit centrally located in a bottom wall of the process chamber;

an afterburner assembly coupled to the exhaust conduit and configured for volatilizing byproducts discharged from the process chamber to prevent deposition of photoresist and byproducts within the process chamber and areas downstream, wherein the exhaust conduit comprises a gas port intermediate to the process chamber and the afterburner assembly and wherein the exhaust conduit is axially aligned with the plasma tube; and an optical detection system optically coupled to the exhaust conduit.

2. The axial flow downstream plasma treatment device of claim 1, further comprising at least one heating lamp positioned below the substrate and in optical communication with a bottom plate of the process chamber, wherein the bottom plate is formed from a material substantially transparent to visible and/or infrared radiation.

3. The axial flow downstream plasma treatment device of claim 1, wherein the afterburner assembly comprises means for generating plasma in the exhaust conduit.

4. The axial flow downstream plasma treatment device of claim 3, wherein the afterburner assembly comprises an RF coil wrapped about an exterior of the exhaust conduit, a matchbox in electrical communication with the RF coil, and a power supply in electrical communication with the matchbox.

5. The axial flow downstream plasma treatment device of claim 1, wherein the plasma generating component comprises a microwave enclosure partitioned into sections, wherein each section has an opening therein for receiving the plasma tube; and means for providing microwave power of a predetermined frequency to the sections.

6. The axial flow downstream plasma treatment device of claim 1, wherein the gas source is substantially free from nitrogen and oxygen.

7. The axial flow downstream plasma treatment device of claim 1, further comprising a second gas source in fluid communication with the plasma tube, wherein the second gas source comprises an oxidizing gas for in situ cleaning of the process chamber.

8. The axial flow downstream plasma treatment device of claim 1, wherein the plasma tube has a smaller opening diameter than a diameter of the upper baffle plate.

9. The axial flow downstream plasma treatment device of claim 1, wherein the upper baffle plate comprises a central region free of apertures.

10. The axial flow downstream plasma treatment device of claim 1, wherein the upper baffle plate has a smaller diameter than the lower baffle plate, and wherein the upper baffle plate and an upper wall of the process chamber form a plenum therebetween.

11. The axial flow downstream plasma treatment device of claim 1, further comprising a loadlock chamber coupled to the process chamber; and a sub-chamber in communication with the load lock chamber, wherein the sub-chamber comprises at least one robot arm having a primary pivot axis within the sub-chamber.

12. The axial flow downstream plasma treatment device of claim 1, further comprising a loadlock chamber and a cold plate disposed approximately in a center of the loadlock chamber.

13. An axial flow downstream plasma treatment device for treating a substrate including a low k dielectric material, comprising, in combination:
a substantially oxygen and nitrogen free gas source;
a gas purifier intermediate to the gas source and the plasma-generating component adapted to reduce oxygen and nitrogen impurity levels to less than 20 parts per million;
a plasma generating component in fluid communication with the gas source, the plasma generating component comprising a plasma tube and a plasma generator coupled to the plasma tube for generating a substantially oxygen and nitrogen free plasma within the plasma tube from the gas source;
a process chamber in fluid communication with the plasma tube comprising a baffle plate assembly at about an inlet of the process chamber, wherein the baffle plate assembly comprises a generally planar upper baffle plate fixedly positioned above a generally planar lower baffle plate, the upper baffle plate being smaller than the lower baffle plate such that the upper baffle plate is free from direct contact with other components defining the plasma processing chamber, the lower baffle plate comprising a plurality of apertures disposed about a central axis, wherein the plurality of apertures increase in density from the central axis to an outer edge of the lower baffle plate, wherein the substrate contains a low k dielectric material;
an exhaust conduit centrally located in a bottom wall of the process chamber;
an afterburner assembly coupled to the exhaust conduit and configured for volatilizing byproducts discharged from the process chamber to prevent deposition of photoresist and byproducts within the process chamber and areas downstream, wherein the exhaust conduit comprises a gas port intermediate to the process chamber and the afterburner assembly; and
an optical detection system coupled to the exhaust conduit.

14. The axial flow downstream plasma treatment device of claim 13, further comprising at least one heating lamp positioned below the substrate and in optical communication with a bottom plate of the process chamber, wherein the bottom plate is formed from a material substantially transparent to infrared radiation.

15. The axial flow downstream plasma treatment device of claim 13, wherein the plasma tube has a smaller opening diameter than a diameter of the upper baffle plate.

16. The axial flow downstream plasma treatment device of claim 13, wherein the afterburner assembly comprises means for generating plasma in the exhaust conduit.

17. The axial flow downstream plasma treatment device of claim 13, wherein the afterburner assembly comprises an RF coil wrapped about an exterior of the exhaust conduit, a matchbox in electrical communication with the RF coil, and a power supply in electrical communication with the matchbox.

18. The axial flow downstream plasma treatment device of claim 13, wherein the plasma generator comprises a microwave enclosure partitioned into sections, wherein each section has an opening therein for receiving the plasma tube; and means for providing microwave power of a predetermined frequency to the sections.

19. The axial flow downstream plasma treatment device of claim 13, wherein the gas source is substantially free from nitrogen and oxygen.

20. The axial flow downstream plasma treatment device of claim 13, further comprising a second gas source in fluid communication with the plasma tube, wherein the second gas source comprises an oxidizing gas for in situ cleaning of the process chamber.

21. The axial flow downstream plasma treatment device of claim 13, further comprising a loadlock chamber coupled to the process chamber; and a sub-chamber in communication with the load lock chamber, wherein the sub-chamber comprises at least one robot arm having a primary pivot axis within the sub-chamber.

22. The axial flow downstream plasma treatment device of claim 13, further comprising a loadlock chamber and a cold plate disposed approximately in a center of the loadlock chamber.

23. A downstream plasma treatment device for treating a substrate, comprising, in combination:
a substantially oxygen and nitrogen free gas source;
a plasma generating component in fluid communication with the gas source, the plasma generating component comprising a plasma tube and a plasma generator coupled to the plasma tube for generating a substantially oxygen and nitrogen free plasma within the plasma tube from the gas source;
a process chamber in fluid communication with the plasma tube having an exhaust conduit centrally located in a bottom wall and axially aligned with the plasma tube, wherein the process chamber houses a generally planar upper baffle plate fixedly positioned above a generally planar lower baffle plate such that the upper baffle plate is free from direct contact with other components defining the plasma processing chamber, and wherein the upper baffle plate is smaller than the lower baffle plate, wherein the process chamber further comprises a baffle plate assembly at about an inlet of the process chamber, wherein the baffle plate assembly comprises a generally planar upper baffle plate fixedly positioned above a generally planar lower baffle plate, the lower baffle plate comprising a plurality of apertures disposed about a central axis, wherein a dimension of each one of the plurality of apertures increases from the central axis to an outer edge of the lower baffle plate, and wherein the baffle plate assembly is positioned generally parallel to the substrate, wherein the substrate contains a low k dielectric material;
a gas purifier intermediate to the gas source and the plasma generator adapted to reduce oxygen and nitrogen impurity levels to less than 20 parts per million;
an afterburner assembly coupled to an exhaust conduit in fluid communication with the process chamber, wherein the afterburner assembly is configured for volatilizing byproducts discharged from the process chamber to prevent deposition of photoresist and byproducts within the process chamber and areas downstream wherein the exhaust conduit comprises a gas port intermediate to the process chamber and the afterburner assembly; and an optical detection system coupled to the exhaust conduit.

24. The plasma treatment device of claim 23, wherein the process chamber further comprises a baffle plate assembly at about an inlet of the process chamber, wherein the baffle plate assembly comprises a generally planar upper baffle plate fixedly positioned above a generally planar lower baffle plate, the lower baffle plate comprising a plurality of apertures disposed about a central axis, wherein the plurality of apertures increase in density from the central axis to an outer edge of the lower baffle plate.

25. The plasma treatment device of claim 23, further comprising at least one heating lamp positioned below the substrate and in optical communication with a bottom plate of the process chamber, wherein the bottom plate is formed from a material substantially transparent to visible and/or infrared radiation.

26. The plasma treatment device of claim 23, wherein the afterburner assembly comprises means for generating plasma in the exhaust conduit.

27. The plasma treatment device of claim 23, wherein the afterburner assembly comprises an RF coil wrapped about an exterior of the exhaust conduit, a matchbox in electrical communication with the RF coil, and a power supply in electrical communication with the matchbox.

28. The plasma treatment device of claim 23, wherein the plasma generating component comprises a microwave enclosure partitioned into sections, wherein each section has an opening therein for receiving the plasma tube; and means for providing microwave power of a predetermined frequency to the sections.

29. The plasma treatment device of claim 23, wherein the gas source is substantially free from nitrogen and oxygen.

30. The plasma treatment device of claim 23, wherein the gas source consists essentially of hydrogen and helium.

31. The plasma treatment device of claim 23, further comprising a second gas source in fluid communication with the plasma tube, wherein the second gas source comprises an oxidizing gas for in situ cleaning of the process chamber and is not in fluid communication with the gas purifier.

32. The plasma treatment device of claim 23, wherein the plasma tube has a smaller opening diameter than a diameter of the upper baffle plate.

33. The plasma treatment device of claim 23, wherein the upper baffle plate comprises a central region free of apertures and a plurality of apertures disposed about the central region.

34. The plasma treatment device of claim 23, wherein the upper baffle plate has a smaller diameter than the lower baffle plate, and wherein the upper baffle plate and an upper wall of the process chamber form a plenum therebetween.

35. The plasma treatment device of claim 23, further comprising a loadlock chamber coupled to the process chamber; and a sub-chamber in communication with the load lock chamber, wherein the sub-chamber comprises at least one robot arm having a primary pivot axis within the sub-chamber.

36. The plasma treatment device of claim 23, further comprising a loadlock chamber and a cold plate disposed approximately in a center of the loadlock chamber.

37. A downstream plasma treatment device for treating a substrate, comprising, in combination:

a substantially oxygen and nitrogen free gas source;

a plasma generating component in fluid communication with the gas source, the plasma generating component comprising a plasma tube and a plasma generator coupled to the plasma tube for generating a substantially oxygen and nitrogen free plasma within the plasma tube from the gas source;

a gas purifier intermediate to the gas source and the plasma-generating component adapted to reduce oxygen and nitrogen impurity levels to less than 20 parts per million;

a process chamber in fluid communication with the plasma tube having an exhaust conduit centrally located in a bottom wall and axially aligned with the plasma tube, wherein the process chamber houses a baffle plate assembly comprising a generally planar upper baffle plate fixedly positioned above a generally planar lower baffle plate such that the upper baffle plate is free from direct contact with other components defining the plasma processing chamber, and wherein the upper baffle plate is smaller than the lower baffle plate, wherein the substrate contains a low k dielectric material; and an afterburner assembly coupled to an exhaust conduit in fluid communication with the process chamber, wherein the afterburner assembly is configured for volatilizing byproducts discharged from the process chamber to prevent deposition of photoresist and byproducts within the process chamber and areas downstream, and wherein the exhaust conduit comprises a gas port intermediate to the process chamber and the afterburner assembly.

\* \* \* \* \*

UNITED STATES PATENT AND TRADEMARK OFFICE
CERTIFICATE OF CORRECTION

| | | |
|---|---|---|
| PATENT NO. | : 8,580,076 B2 | Page 1 of 1 |
| APPLICATION NO. | : 10/249962 | |
| DATED | : November 12, 2013 | |
| INVENTOR(S) | : Becknell et al. | |

It is certified that error appears in the above-identified patent and that said Letters Patent is hereby corrected as shown below:

In the Drawings

Sheet 5 of 9, Fig. 5:            Delete "13E" and insert --136--

Sheet 5 of 9, Fig. 5:            Delete "13" and insert --134--

In the Specification

Column 8, Description, Line 8:            After "the" insert --gas--

Column 8, Description, Line 34:            After "the" insert --gas--

Column 8, Description, Line 38:            Delete "asher." and insert --asher--

Column 8, Description, Line 45:            After "the" insert --microwave--

Column 10, Description, Line 4:            Delete "multiply" and insert --multiple--

Column 11, Description, Line 67:            Delete "OF" and insert --or--

Column 12, Description, Line 3:            Delete "plate," and insert --plate--

Column 15, Description, Line 66:            Delete "tipper" and insert --upper--

Column 16, Description, Line 1:            After "The" insert --upper link--

Column 16, Description, Line 6:            Delete "arm" and insert --common pivot axis--

Column 16, Description, Line 16:            Delete "104" and insert --110--

Column 16, Description, Line 17:            Delete "193" and insert --228--

Signed and Sealed this
Twenty-second Day of April, 2014

Michelle K. Lee
*Deputy Director of the United States Patent and Trademark Office*